(12) United States Patent
Dobisz et al.

(10) Patent No.: US 7,976,715 B2
(45) Date of Patent: Jul. 12, 2011

(54) METHOD USING BLOCK COPOLYMERS FOR MAKING A MASTER MOLD WITH HIGH BIT-ASPECT-RATIO FOR NANOIMPRINTING PATTERNED MAGNETIC RECORDING DISKS

(75) Inventors: Elizabeth Ann Dobisz, San Jose, CA (US); Ricardo Ruiz, San Bruno, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 101 days.

(21) Appl. No.: 12/539,818

(22) Filed: Aug. 12, 2009

(65) Prior Publication Data

US 2009/0311363 A1 Dec. 17, 2009

Related U.S. Application Data

(63) Continuation-in-part of application No. 12/141,062, filed on Jun. 17, 2008.

(51) Int. Cl.
*C25F 3/00* (2006.01)
*B44C 1/22* (2006.01)
*G11B 5/706* (2006.01)

(52) U.S. Cl. ............... 216/11; 216/22; 428/848

(58) Field of Classification Search ............. 29/603.01; 216/41, 11, 22; 425/256, 502, 548, 599; 428/800, 826, 844.6, 846, 847.4, 848, 848.5
See application file for complete search history.

(56) References Cited

U.S. PATENT DOCUMENTS

| | | | |
|---|---|---|---|
| 5,766,718 A * | 6/1998 | Matsuda et al. | ........... 428/848.5 |
| 6,042,998 A | 3/2000 | Brueck et al. | |
| 6,421,195 B1 | 7/2002 | Rubin et al. | |
| 6,746,825 B2 * | 6/2004 | Nealey et al. | ............... 430/315 |
| 7,080,596 B2 | 7/2006 | Lee et al. | |
| 7,347,953 B2 | 3/2008 | Black et al. | |

(Continued)

FOREIGN PATENT DOCUMENTS

JP 2000113533 4/2000

(Continued)

OTHER PUBLICATIONS

Naito, Katsuyuki; Hieda, Hiroyuki; Sakurai, Masatoshi; Kamata, Yoshiyuki; Asakawa, Koji. 2.5-inch Disk Patterned Media Prepared by an Artificially Assisted Self-Assembling Method. IEEE Transactions on Magnetics. vol. 38, No. 5 Sep. 2002.*

(Continued)

*Primary Examiner* — Lan Vinh
*Assistant Examiner* — Patti Lin
(74) *Attorney, Agent, or Firm* — Thomas R. Berthold

(57) ABSTRACT

A method for making a master mold that is used in the nanoimprinting process to make patterned-media disks with patterned data islands uses guided self-assembly of a block copolymer into its components. Conventional or e-beam lithography is used to first form a pattern of generally radial stripes on a substrate, with the stripes being grouped into annular zones or bands. A block copolymer material is then deposited on the pattern, resulting in guided self-assembly of the block copolymer into its components to multiply the generally radial stripes into generally radial lines. Various methods, including conventional lithography, guided self-assembly of a second block copolymer, and e-beam lithography, are then used to form concentric rings over the generally radial lines. After etching and resist removal, the master mold has a pattern of either pillars or holes, depending on the method used.

25 Claims, 15 Drawing Sheets

U.S. PATENT DOCUMENTS

| | | | |
|---|---|---|---|
| 7,521,094 B1 * | 4/2009 | Cheng et al. | 427/532 |
| 2002/0168548 A1 * | 11/2002 | Sakurai et al. | 428/694 BR |
| 2004/0241574 A1 | 12/2004 | Dai et al. | |
| 2005/0094549 A1 * | 5/2005 | Hieda et al. | 369/277 |
| 2006/0134556 A1 | 6/2006 | Nealey et al. | |
| 2006/0276043 A1 | 12/2006 | Johnson et al. | |
| 2007/0092650 A1 | 4/2007 | Albrecht et al. | |
| 2007/0121375 A1 | 5/2007 | Sewell | |
| 2008/0192606 A1 * | 8/2008 | Kimura et al. | 369/94 |

FOREIGN PATENT DOCUMENTS

| | | |
|---|---|---|
| WO | 2007058324 | 5/2007 |

OTHER PUBLICATIONS

Park, Sang-Min; Stoykovich, Mark P.; Ruiz, Ricardo; Zhang, Ying; Black, Charles T.; Nealey, Paul F. Directed Assembly of Lamellae-Forming BLock Copolymers by Using Chemically and Topographically Patterned Substrates. Advanced Materials, 2007.*

Park, Miri; Harrison, Christopher; Chaikin, Paul; Register, Richard; Adamson, Douglas. Block Copolymer Lithography: Periodic Arrays of~10A11 Holes in 1 Square Centimeter. Science. vol. 276. May 30, 1997.*

Stoykovich, Mark; Kang, Huiman; Daoulas, Kostas; Liu, Guoliang; Liu, Chi-Chun; Pablo, Juan; Muller, Marcus; Nealey, Paul. Directed Self-Assembly of Block Copolymers for Nanolithography: Fabrication of Isolated Features and Essential Integrated Circuit Geometries.*

Bandic et al., "Patterned magnetic media: impact of nanoscale patterning on hard disk drives", Solid State Technology S7+ Suppl. S, Sep. 2006.

Terris et al., "Topical Review: Nanofabricated and self-assembled magnetic structures as data storage media", J. Phys. D: Appl. Phys. 38 (2005) R199-R222.

Moritz et al., "Patterned Media Made From Pre-Etched Wafers: A Promising Route Toward Ultrahigh-Density Magnetic Recording", IEEE Transactions on Magnetics, vol. 38, No. 4, Jul. 2002, pp. 1731 1736.

Kim et al.,"Rapid Directed Self-Assembly of Lamellar Microdomains from a Block Copolymer Containing Hybrid", Proc. of SPIE vol. 6921, 692129, (2008).

Kim et al., "Device-Oriented Directed Self-Assembly of Lamella Microdomains from a Block Copolymer Containing Hybrid", Proc. of SPIE vol. 6921, 69212B, (2008).

Kim et al., "Self-Aligned, Self-Assembled Organosilicate Line Patterns of ~20nm Half-Pitch from Block Copolymer Mediated Self-Assembly", Proc. of SPIE vol. 6519, 65191H, (2007).

Black, C. T. et al., "Polymer self assembly in semiconductor microelectronics", IBM Journal of Research and Development, vol. 51, No. 5, p. 605 (2007).

Thurn-Albrecht, T. et al., "Nanoscopic Templates from Oriented Block Copolymer Films", Advanced Materials 2000, 12, 787.

Dobisz, E. A. et al., "Thin Silicon-Nitride Films for Reduction of Linewidth and Proximity Effects in Electron-Beam Lithography", Journal of Vacuum Science & Technology B, vol. 10, Issue 6, Nov.-Dec. 1992, pp. 3067-3071.

* cited by examiner

METHOD USING BLOCK COPOLYMERS FOR MAKING A MASTER MOLD WITH HIGH BIT-ASPECT-RATIO FOR NANOIMPRINTING PATTERNED MAGNETIC RECORDING DISKS

RELATED APPLICATION

This application is a continuation-in-part of application Ser. No. 12/141,062 filed Jun. 17, 2008.

BACKGROUND OF THE INVENTION

1. Field of the Invention

This invention relates generally to patterned-media magnetic recording disks, wherein each data bit is stored in a magnetically isolated data island on the disk, and more particularly to a method for making a master mold to be used for nanoimprinting the patterned-media disks.

2. Description of the Related Art

Magnetic recording hard disk drives with patterned magnetic recording media have been proposed to increase data density. In patterned media, the magnetic recording layer on the disk is patterned into small isolated data islands arranged in concentric data tracks. To produce the required magnetic isolation of the patterned data islands, the magnetic moment of spaces between the islands must be destroyed or substantially reduced to render these spaces essentially nonmagnetic. In one type of patterned media, the data islands are elevated regions or pillars that extend above "trenches" and magnetic material covers both the pillars and the trenches, with the magnetic material in the trenches being rendered nonmagnetic, typically by "poisoning" with a material like silicon (Si). In another type of patterned media, the magnetic material is deposited first on a flat disk substrate. The magnetic data islands are then formed by milling, etching or ion-bombarding of the area surrounding the data islands. Patterned-media disks may be longitudinal magnetic recording disks, wherein the magnetization directions are parallel to or in the plane of the recording layer, or perpendicular magnetic recording disks, wherein the magnetization directions are perpendicular to or out-of-the-plane of the recording layer.

One proposed method for fabricating patterned-media disks is by nanoimprinting with a template or mold, sometimes also called a "stamper", that has a topographic surface pattern. In this method the magnetic recording disk substrate with a polymer film on its surface is pressed against the mold. The polymer film receives the reverse image of the mold pattern and then becomes a mask for subsequent etching of the disk substrate to form the pillars on the disk. In one type of patterned media, the magnetic layer and other layers needed for the magnetic recording disk are then deposited onto the etched disk substrate and the tops of the pillars to form the patterned-media disk. In another type of patterned media, the magnetic layers and other layers needed for the magnetic recording disk are first deposited on the flat disk substrate. The polymer film used with nanoimprinting is then pressed on top of these layers. The polymer film receives the reverse image of the mold pattern and then becomes a mask for subsequent milling, etching or ion-bombarding the underlying layers. The mold may be a master mold for directly imprinting the disks. However, the more likely approach is to fabricate a master mold with a pattern of pillars corresponding to the pattern of pillars desired for the disks and to use this master mold to fabricate replica molds. The replica molds will thus have a pattern of recesses or holes corresponding to the pattern of pillars on the master mold. The replica molds are then used to directly imprint the disks. Nanoimprinting of patterned media is described by Bandic et al., "Patterned magnetic media: impact of nanoscale patterning on hard disk drives", *Solid State Technology* S7+ Suppl. S, September 2006; and by Terris et al., "TOPICAL REVIEW: Nanofabricated and self-assembled magnetic structures as data storage media", *J. Phys. D: Appl. Phys.* 38 (2005) R199-R222.

In patterned media, the bit-aspect-ratio (BAR) of the pattern or array of discrete data islands arranged in concentric tracks is the ratio of track spacing or pitch in the radial or cross-track direction to the island spacing or pitch in the circumferential or along-the-track direction. This is the same as the ratio of linear island density in bits per inch (BPI) in the along-the-track direction to the track density in tracks per inch (TPI) in the cross-track direction. The BAR is also equal to the ratio of the radial dimension of the bit cell to the circumferential dimension of the bit cell, where the data island is located within the bit cell. The bit cell includes not only the magnetic data island but also one-half of the non-magnetic space between the data island and its immediately adjacent data islands. The data islands have a ratio of radial length to circumferential width, referred to as the island aspect ratio (IAR), that can be close to or greater than the BAR.

In patterned media, there are two opposing requirements relating to the BAR. The first requirement is that to minimize the resolution requirement for fabricating the islands, it is preferable that the array of islands have a low BAR (about 1). The second requirement is that to allow for a wider write head pole, which is necessary for achieving a high write field to allow the use of high coercivity media for thermal stability, it is preferable that the array of islands have a higher BAR (about 2 or greater). Also, the transition from disk drives with conventional continuous media to disk drives with patterned media is simplified if the BAR is high because in conventional disk drives the BAR is between about 5 to 10. Other benefits of higher BAR include lower track density, which simplifies the head-positioning servo requirements, and a higher data rate.

The making of the master template or mold is a difficult and challenging process. The use of electron beam (e-beam) lithography using a Gaussian beam rotary-stage e-beam writer is viewed as a possible method to make a master mold capable of nanoimprinting patterned-media disks with a BAR of about 1 with a track pitch (island-to-island spacing in the radial or cross-track direction) of about 35 nm, and an island pitch (island-to-island spacing in the circumferential or along-the-track direction) of about 35 nm. If the data islands have a radial length and circumferential width each of about 20 nm for an IAR of 1, then these dimensions generally limit the areal bit density of patterned-media disks to about 500 Gbit/in$^2$. To achieve patterned-media disks with both an ultra-high areal bit density (at least 1 Terabits/in$^2$) and a higher BAR, a track pitch of 50 nm and an island pitch of about 12.5 nm will be required, which would result in a BAR of 4. However, a master mold capable of nanoimprinting patterned-media disks with an island pitch of 12.5 nm over an area equal to the data area of a disk is not achievable with the resolution of e-beam lithography.

What is needed is a master mold and a method for making it that can result in patterned-media magnetic recording disks with both the required high areal bit density and higher BAR (greater than 1 and preferably about 2 or greater).

SUMMARY OF THE INVENTION

The present invention relates to a method for making a master mold that is used in the nanoimprinting process to make patterned-media disks with an island pitch difficult to achieve with the resolution of e-beam lithography. The master mold may be used to directly nanoimprint the disks, but more likely is used to make replica molds which are then used to directly nanoimprint the disks. The method uses conventional or e-beam lithography to form a pattern of generally radial stripes on a substrate, with the stripes being grouped into annular zones or bands. A block copolymer material is deposited on the pattern, resulting in guided self-assembly of the block copolymer into its components to multiply the generally radial stripes into generally radial lines. The radial lines preferably have a higher circumferential density than that of the radial stripes. Various methods, including conventional lithography, guided self-assembly of a second block copolymer, and e-beam lithography, are then used to form concentric rings over the generally radial lines. The concentric rings are used to define the radial length of the islands formed by the master mold. After etching and resist removal, the master mold has a pattern of either pillars or holes, depending on the method used. The pillars or holes are arranged in circular rings, with the rings grouped into annular bands. The spacing of the concentric rings is selected so that following the etching process the master mold has an array of pillars or holes with the desired BAR, which is greater than 1, preferably about 2 or greater. Because the invention allows the circumferential density of the master mold pillars or holes to be at least doubled from what could be achieved with just e-beam lithography, the subsequently nanoimprinted patterned-media disks can have both a high BAR (greater than 1 and preferably equal to or greater than 2) and an ultra-high areal density.

A first embodiment of the method uses conventional optical or e-beam lithography to form concentric rings of resist over the generally radial lines of one of the block copolymer components. After etching to remove portions of the remaining block copolymer component between the concentric rings, and removal of the resist, a pattern of pillars of the remaining block copolymer component is formed on the substrate. These pillars of remaining block copolymer component are used as an etch mask to pattern the substrate. After etching and removal of the pillars of remaining block copolymer component, a master mold remains that has pillars of substrate material arranged in circular rings, with the rings grouped into annular bands.

A second embodiment of the method uses a first block copolymer material with bulk period $L_0=L_{rad}$, resulting in guided self-assembly of the first block copolymer into its components to multiply the generally radial stripes into generally radial lines of alternating first block copolymer components. The radial lines of one of the components are removed, leaving the radial lines of the remaining component of the first block copolymer. A protective layer is then deposited over the radial lines of the remaining component of the first block copolymer to prevent their movement during subsequent processing. Then, a second block copolymer material with bulk period $L_0=L_{circ}$ is deposited over these radial lines to define generally circumferential rings. The circumferential rings of one of the components of the second block copolymer are removed, leaving the circumferential rings of the remaining component of the second block copolymer. The circumferential rings of the remaining second block copolymer component and the underlying radial lines of the remaining first block copolymer component form a grid that functions as an etch mask. Etching of the substrate through this mask, followed by removal of the remaining block copolymer material, results in a master mold with a pattern of recesses or holes arranged in circular rings, with the rings grouped into annular bands. The ratio of $L_{circ}/L_{rad}$ defines the BAR for the disk made from the mold.

A third embodiment of the method uses a block copolymer material with bulk period $L_0$, resulting in guided self-assembly of the block copolymer into its components to multiply the generally radial stripes into generally radial lines of alternating block copolymer A and B components. Then an e-beam writer generates a high dose e-beam in a pattern of concentric rings which cross-links the A and B copolymers exposed to the high dose e-beam, resulting in concentric rings formed of cross-linked polymer material. The underlying radial lines of the B component are then removed, leaving the cross-linked concentric rings and underlying radial lines of the A component. This structure then serves as an etch mask to pattern recesses or holes into the underlying substrate.

For a fuller understanding of the nature and advantages of the present invention, reference should be made to the following detailed description taken together with the accompanying figures.

DETAILED DESCRIPTION OF THE INVENTION

Figure 1:
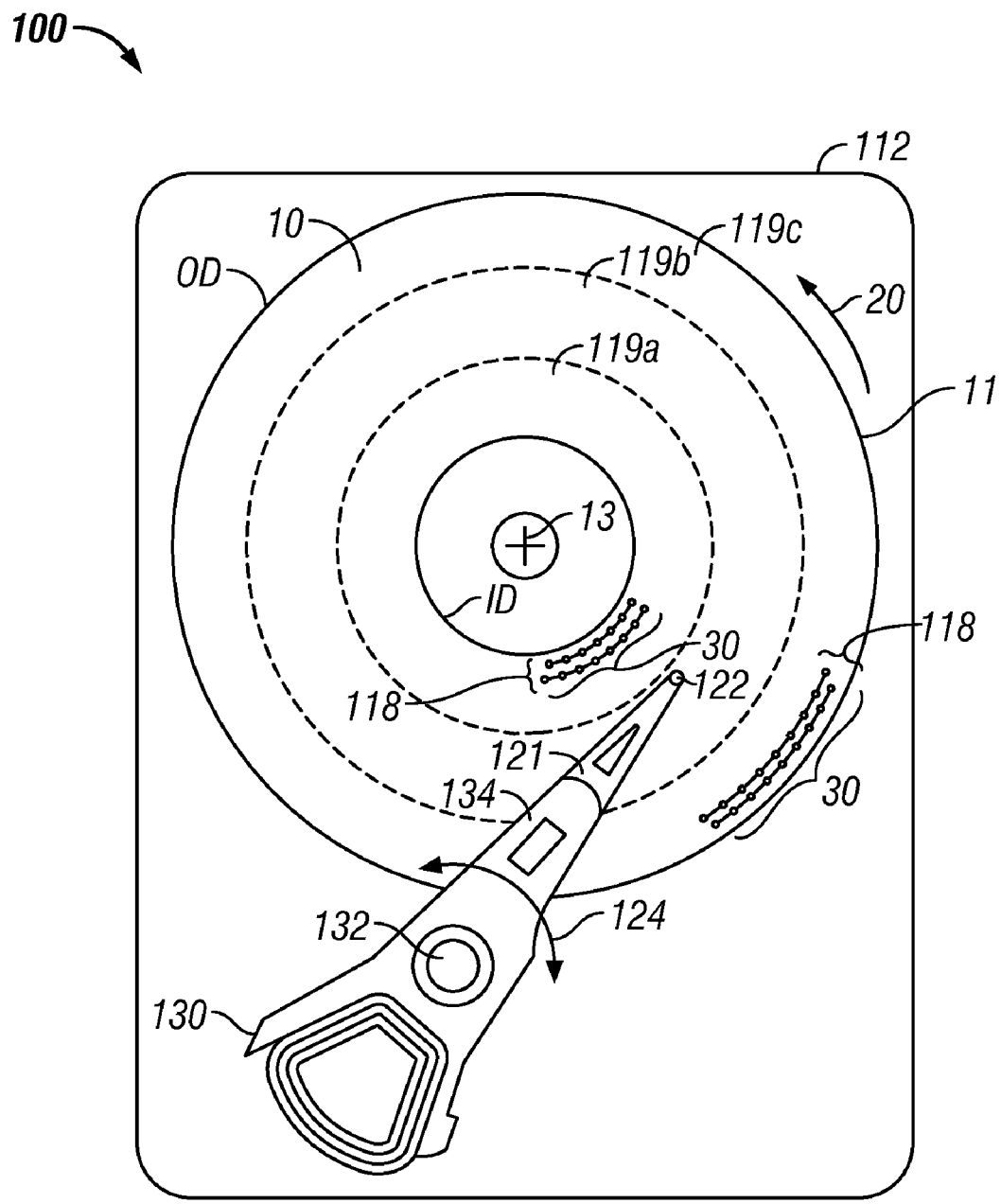
FIG. 1 is a top view of a disk drive with a patterned-media type of magnetic recording disk as described in the prior art.

FIG. 1 is a top view of a disk drive 100 with a patterned magnetic recording disk 10 as described in the prior art. The drive 100 has a housing or base 112 that supports an actuator 130 and a drive motor for rotating the magnetic recording disk 10 about its center 13. The actuator 130 may be a voice coil motor (VCM) rotary actuator that has a rigid arm 134 and rotates about pivot 132 as shown by arrow 124. A head-suspension assembly includes a suspension 121 that has one end attached to the end of actuator arm 134 and a head carrier 122, such as an air-bearing slider, attached to the other end of suspension 121. The suspension 121 permits the head carrier 122 to be maintained very close to the surface of disk 10. A magnetoresistive read head (not shown) and an inductive write head (not shown) are typically formed as an integrated read/write head patterned on the trailing surface of the head carrier 122, as is well known in the art.

The patterned magnetic recording disk 10 includes a disk substrate 11 and discrete data islands 30 of magnetizable material on the substrate 11. The data islands 30 function as discrete magnetic bits for the storage of data and are arranged in radially-spaced circular tracks 118, with the tracks 118 being grouped into annular bands 119a, 119b, 119c. The grouping of the data tracks into annular zones or bands permits banded recording, wherein the angular spacing of the data islands, and thus the data rate, is different in each band. In FIG. 1, only a few islands 30 and representative tracks 118 are shown in the inner band 119a and the outer band 119c. As the disk 10 rotates about its center 13 in the direction of arrow 20, the movement of actuator 130 allows the read/write head on the trailing end of head carrier 122 to access different data tracks 118 on disk 10. Rotation of the actuator 130 about pivot 132 to cause the read/write head on the trailing end of head carrier 122 to move from near the disk inside diameter (ID) to near the disk outside diameter (OD) will result in the read/write head making an arcuate path across the disk 10.

Figure 2:
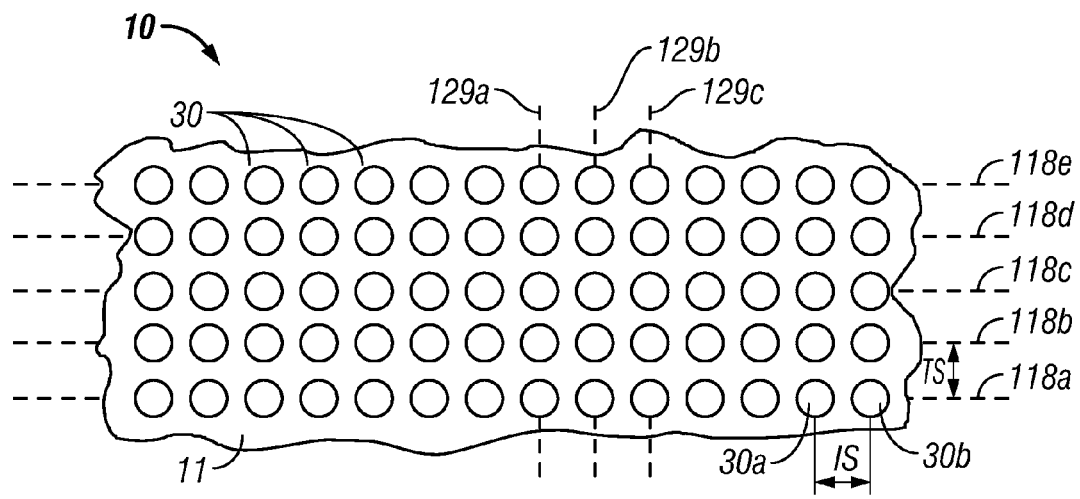
FIG. 2 is a top view of an enlarged portion of a patterned-media type of magnetic recording disk showing the detailed arrangement of the data islands in one of the bands on the surface of the disk substrate.

FIG. 2 is a top view of an enlarged portion of disk 10 showing the detailed arrangement of the data islands 30 in one of the bands on the surface of disk substrate 11 according to the prior art. While the islands 30 are shown as being circularly shaped, they may have other shapes, such as generally rectangularly or generally elliptical. The islands 30 contain magnetizable recording material and are arranged in tracks spaced-apart in the radial or cross-track direction, as shown by tracks 118a-118e. The tracks are typically spaced apart by a nearly fixed track pitch or spacing TS. Within each track 118a-118e, the islands 30 are roughly equally spaced apart by a nearly fixed along-the-track island pitch or spacing IS, as shown by typical islands 30a, 30b, where IS is the spacing between the centers of two adjacent islands in a track. In FIG. 2, TS and IS are depicted as being equal, so the BAR is 1. The islands 30 are also arranged into generally radial lines, as shown by radial lines 129a, 129b and 129c that extend from disk center 13 (FIG. 1). Because FIG. 2 shows only a very small portion of the disk substrate 11 with only a few of the data islands, the pattern of islands 30 appears to be two sets of perpendicular lines. However, tracks 118a-118e are concentric rings centered about the center 13 of disk 10 and the lines 129a, 129b, 129c are not parallel lines, but radial lines extending from the center 13 of disk 10. Thus the angular spacing between adjacent islands as measured from the center 13 of the disk for adjacent islands in lines 129a and 129b in a radially inner track (like track 118e) is the same as the angular spacing for adjacent islands in lines 129a and 129b in a radially outer track (like track 118a).

The generally radial lines (like lines 129a, 129b, 129c) may be perfectly straight radial lines but are preferably arcs or arcuate-shaped radial lines that replicate the arcuate path of the read/write head on the rotary actuator. Such arcuate-shaped radial lines provide a constant phase position of the data islands as the head sweeps across the data tracks. There is a very small radial offset between the read head and the write head, so that the synchronization field used for writing on a track is actually read from a different track. If the islands between the two tracks are in phase, which is the case if the radial lines are arcuate-shaped, then writing is greatly simplified.

Figure 3:
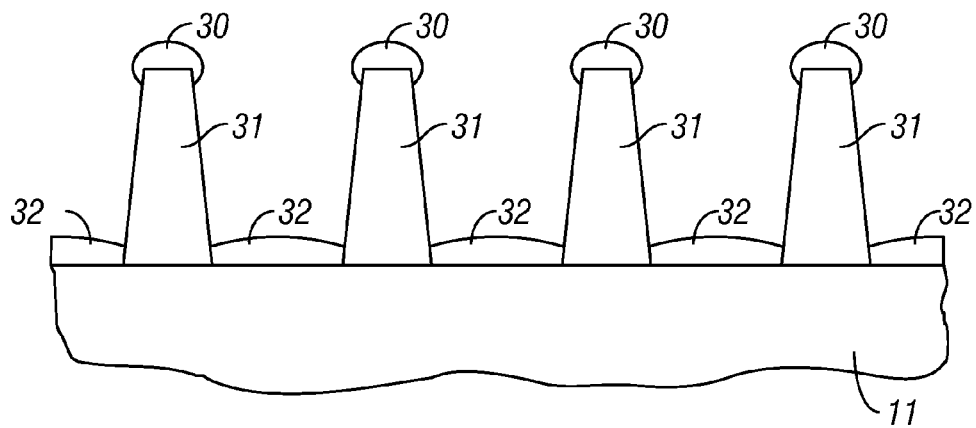
FIG. 3 is a side sectional view of one type of a patterned-media disk showing the data islands as elevated, spaced-apart pillars that extend above the disk substrate surface with trenches between the pillars.

Patterned-media disks like that shown in FIG. 2 may be longitudinal magnetic recording disks, wherein the magnetization directions in the magnetizable recording material are parallel to or in the plane of the recording layer in the islands, or perpendicular magnetic recording disks, wherein the magnetization directions are perpendicular to or out-of-the-plane of the recording layer in the islands. To produce the required magnetic isolation of the patterned data islands, the magnetic moment of the regions between the islands must be destroyed or substantially reduced to render these spaces essentially nonmagnetic. Patterned media may be fabricated by any of several known techniques. In one type of patterned media, the data islands are elevated, spaced-apart pillars that extend above the disk substrate surface to define troughs or trenches on the substrate surface between the pillars. This type of patterned media is shown in the sectional view in FIG. 3. In this type of patterned media the substrate 11 with a pre-etched pattern of pillars 31 and trenches or regions between the pillars can be produced with relatively low-cost, high volume nanoimprinting process using a master template or mold. The magnetic recording layer material is then deposited over the entire surface of the pre-etched substrate to cover both the ends of the pillars 31 and the trenches between the pillars 31, resulting in the data islands 30 of magnetic recording layer material and trenches 32 of magnetic recording layer material. The trenches 32 of recording layer material may be spaced far enough from the read/write head to not adversely affect reading or writing to the recording layer material in islands 30, or the trenches may be rendered nonmagnetic by "poisoning" with a material like Si. This type of patterned media is described by Moritz et al., "Patterned Media Made From Pre-Etched Wafers: A Promising Route Toward Ultra-high-Density Magnetic Recording", *IEEE Transactions on Magnetics*, Vol. 38, No. 4, July 2002, pp. 1731-1736.

Figure 4:
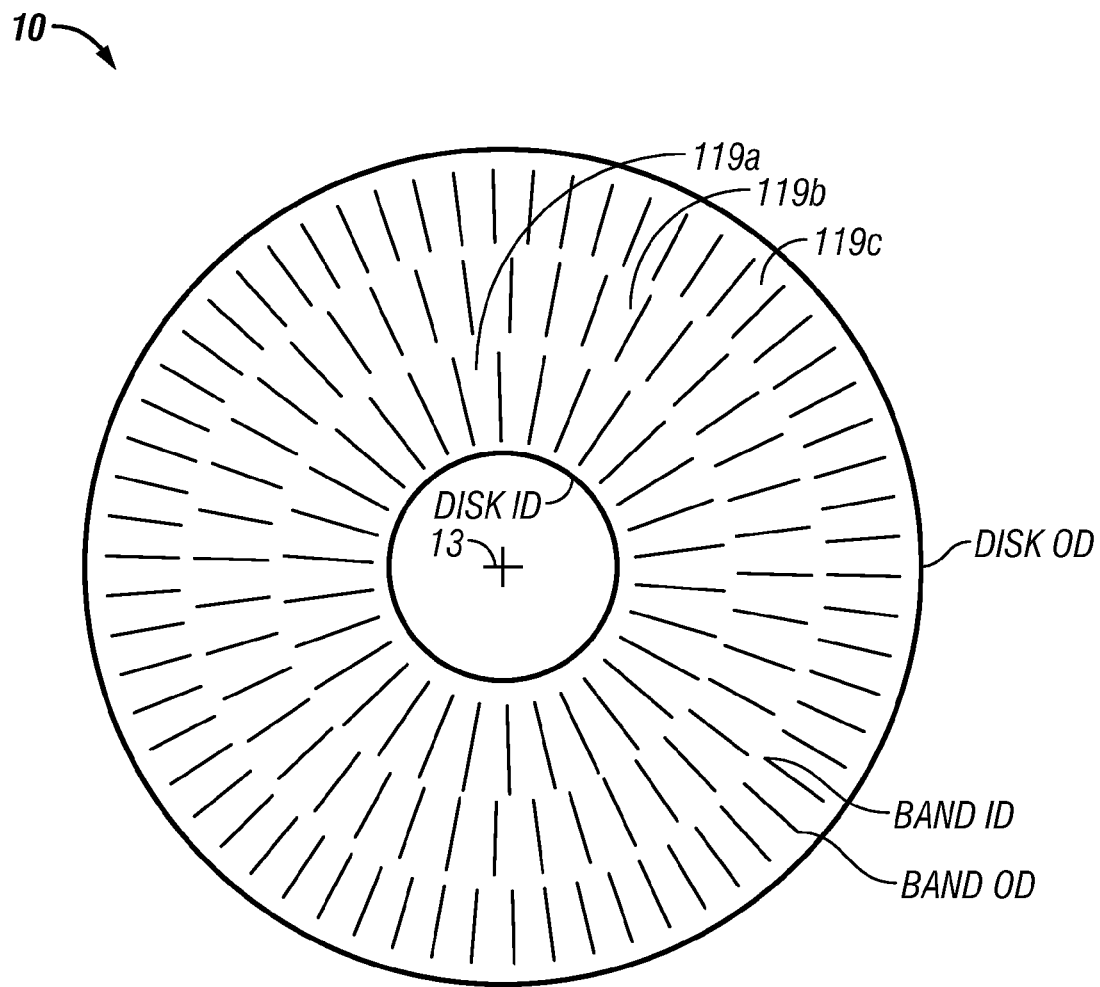
FIG. 4 is a schematic view of a patterned-media disk showing a pattern of radial lines in three annular bands, with each radial line meant to represent data islands from all the concentric tracks in the band.

FIG. 4 is a schematic view of patterned-media disk 10 showing a pattern of radial lines in three annular bands 119a-119c. Each radial line is meant to represent data islands from all the concentric tracks in the band. The circumferential density of the radial lines is similar in all three bands, with the angular spacing of the lines being adjusted in the bands to have smaller angular spacing in the direction from the disk inside diameter (ID) to outside diameter (OD), so that the circumferential density of the radial lines, and thus the "linear" or along-the-track density of data islands, stays relatively constant over all the bands on the disk. In actuality, a typical disk is divided into about 20 annular bands, which allows the linear density to remain constant to within a few percent across all bands. Within each band, the radial lines are subdivided (not shown) into very short radial segments or lengths arranged in concentric rings, with each ring being a data track and each radial segment or length being a discrete data island. Each annular band, like band 119c, has a band ID and a band OD. Also, in actuality the generally radial lines are more typically generally arcuate lines that replicate the path of the read/write head mounted on the end of the rotary actuator.

The making of the master template or mold to achieve an ultrahigh density patterned-media disk is a difficult and challenging process. The use of electron beam (e-beam) lithography using a Gaussian beam rotary-stage e-beam writer is viewed as a possible method to make the master mold. However, to achieve patterned-media disks with both higher areal bit density (greater than 1 Tbit/in$^2$) and a higher BAR, a track pitch of about 50 nm and an island pitch of about 12.5 nm will be required, which would result in a BAR of 4. A master mold capable of nanoimprinting patterned-media disks with an island pitch of 12.5 nm is difficult to fabricate due to the limited resolution of e-beam lithography. Further increases in areal density will require even smaller and denser features. For example, an areal density of 5 Tb/in$^2$ with a BAR of 2 will require an island pitch along-the-track of 8 nm.

The present invention relates to a method for making a master mold that is used in the nanoimprinting process to make patterned-media disks with an island pitch difficult to achieve with the resolution of e-beam lithography, thus enabling both higher areal bit density (1 Tbit/in$^2$ and higher) and a high BAR (greater than 1, preferably equal to or greater than 2). The master mold may be used to directly nanoimprint the disks, but more likely is used to make replica molds which are then used to directly nanoimprint the disks. The method uses conventional or e-beam lithography to form a pattern of generally radial stripes on a substrate, with the stripes being grouped into annular zones or bands. A block copolymer material is deposited on the pattern, resulting in guided self-assembly of the block copolymer into its components to multiply the generally radial stripes into generally radial lines. The radial lines preferably have a higher circumferential density than that of the radial stripes. Various methods, including conventional lithography, guided self-assembly of a second block copolymer, and e-beam lithography, are then used to form concentric rings over the generally radial lines. The concentric rings are used to define the radial length of the islands formed by the master mold. After etching and resist removal, the master mold has a pattern of either pillars or holes, depending on the method used. The pillars or holes are arranged in circular rings, with the rings grouped into annular bands. The spacing of the concentric rings is selected so that following the etching process the master mold has an array of pillars or holes with the desired BAR, which is greater than 1, preferably about 2 or greater. Because the invention allows the circumferential density of the master mold pillars or holes to be at least doubled from what could be achieved with just e-beam lithography, the subsequently nanoimprinted patterned-media disks can have both a high BAR (greater than 1 and preferably equal to or greater than 2) and an ultra-high areal density.

Self-assembling block copolymers have been proposed for creating periodic nanometer (nm) scale features. A self-assembling block copolymer typically contains two or more different polymeric block components, for example components A and B, that are immiscible with one another. Under suitable conditions, the two or more immiscible polymeric block components separate into two or more different phases or microdomains on a nanometer scale and thereby form ordered patterns of isolated nano-sized structural units. There are many types of block copolymers that can be used for forming the self-assembled periodic patterns. If one of the components A or B is selectively removable without having to remove the other, then an orderly arranged structural units of the un-removed component can be formed. There are numerous references describing self-assembling block copolymers, including U.S. Pat. No. 7,347,953 B2; Kim et al., "Rapid Directed Self-Assembly of Lamellar Microdomains from a Block Copolymer Containing Hybrid", *Proc. of SPIE* Vol. 6921, 692129, (2008); Kim et al., "Device-Oriented Directed Self-Assembly of Lamella Microdomains from a Block Copolymer Containing Hybrid", *Proc. of SPIE* Vol. 6921, 69212B, (2008); and Kim et al., "Self-Aligned, Self-Assembled Organosilicate Line Patterns of ~20 nm Half-Pitch from Block Copolymer Mediated Self-Assembly", *Proc. of SPIE* Vol. 6519, 65191H, (2007).

Specific examples of suitable block copolymers that can be used for forming the self-assembled periodic patterns include, but are not limited to: poly(styrene-block-methyl methacrylate) (PS-b-PMMA), poly(ethylene oxide-block-isoprene) (PEO-b-PI), poly(ethylene oxide-block-butadiene) (PEO-b-PBD), poly(ethylene oxide-block-styrene) (PEO-b-PS), poly(ethylene oxide-block-methylmethacrylate) (PEO-b-PMMA), poly(ethyleneoxide-block-ethylethylene) (PEO-b-PEE), poly(styrene-block-vinylpyridine) (PS-b-PVP), poly(styrene-block-isoprene) (PS-b-PI), poly(styrene-block-butadiene) (PS-b-PBD), poly(styrene-block-ferrocenyldimethylsilane) (PS-b-PFS), poly(butadiene-block-vinylpyridine) (PBD-b-PVP), poly(isoprene-block-methyl methacrylate) (PI-b-PMMA), and poly(styrene-block-dymethylsiloxane) (PS-b-PDMS).

The specific self-assembled periodic patterns formed by the block copolymer are determined by the molecular volume ratio between the first and second polymeric block components A and B. When the ratio of the molecular volume of the second polymeric block component B over the molecular volume of the first polymeric block component A is less than about 80:20 but greater than about 60:40, the block copolymer will form an ordered array of cylinders composed of the first polymeric block component A in a matrix composed of the second polymeric block component B. When the ratio of the molecular volume of the first polymeric block component A over the molecular volume of the second polymeric block component B is less than about 60:40 but is greater than about 40:60, the block copolymer will form alternating lamellae composed of the first and second polymeric block components A and B. In the present invention, the un-removed component is to be used as an etch mask, so ordered arrays of alternating lamellae and alternating cylinders are of interest.

The periodicity or bulk period ($L_0$) of the repeating structural units in the periodic pattern is determined by intrinsic polymeric properties such as the degree of polymerization N and the Flory-Huggins interaction parameter $\chi$. $L_0$ scales with the degree of polymerization N, which in turn correlates with the molecular weight M. Therefore, by adjusting the total molecular weight of the block copolymer of the present invention, the bulk period ($L_0$) of the repeating structural units can be selected.

To form the self-assembled periodic patterns, the block copolymer is first dissolved in a suitable solvent system to form a block copolymer solution, which is then applied onto a surface to form a thin block copolymer layer, followed by annealing of the thin block copolymer layer, which causes phase separation between the different polymeric block components contained in the block copolymer. The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone. The block copolymer solution can be applied to the substrate surface by any suitable techniques, including, but not limited to: spin casting, coating, spraying, ink coating, dip coating, etc. Preferably, the block copolymer solution is spin cast onto the substrate surface to form a thin block copolymer layer. After application of the thin block copolymer layer onto the substrate surface, the entire substrate is annealed to effectuate microphase segregation of the different block components contained by the block copolymer, thereby forming the periodic patterns with repeating structural units.

The block copolymer films in the above-described techniques self-assemble without any direction or guidance. This undirected self-assembly results in patterns with defects so it is not practical for applications that require long-range ordering, such as for making annular bands of radial lines on a master mold for nanoimprinting patterned-media disks.

Lithographically patterned surfaces have been proposed to guide or direct the self-assembly of block copolymer domains. One approach uses interferometric lithography to achieve ordering of the domains with registration of the underlying chemical contrast pattern on the substrate. Lamellar and cylindrical domains may be formed on a substrate by this technique, as described in U.S. Pat. No. 6,746,825. However, interferometric lithography cannot be used to make annular bands of radial lines. US 2006/0134556 A1 describes techniques for creating a chemical contrast pattern to guide the self-assembly of block copolymers to form aperiodic patterns. Also, in both of these approaches to create chemical contrast patterns on the substrate to guide the self-assembly of block copolymers, the periodicity of the underlying chemical contrast pattern matches the bulk period $L_0$ of the block copolymer. For example, in US 2006/0134556 A1, $L_0$ is about 40 nm, so the lithographically-patterned substrate used to guide the self-assembly also has a period of about 40 nm, which can be achieved by conventional or e-beam lithography. However, it is difficult to use conventional or e-beam lithography to create a chemical contrast pattern for a block copolymer with $L_0$ between about 8 nm and 30 nm.

First Embodiment

A first embodiment of the method of this invention for making the master mold uses conventional optical or e-beam lithography to form a pattern of generally radial stripes on a substrate, with the stripes being grouped into annular zones or bands. A block copolymer material is deposited on the pattern, resulting in guided self-assembly of the block copolymer into its components to multiply the generally radial stripes into generally radial lines of alternating block copolymer components. The radial lines of one of the components are removed, leaving the radial lines of the remaining component to be used as an etch mask to etch the substrate. A protective layer is then deposited over the radial lines of the remaining component to prevent their movement during subsequent processing. Conventional lithography is then used to form concentric rings over the generally radial lines of the remaining component. After etching to remove portions of the remaining block copolymer component between the concentric rings, and removal of the resist, a pattern of pillars of the remaining block copolymer component is formed on the substrate. These pillars of remaining block copolymer component are used as an etch mask to pattern the substrate. After etching and removal of the pillars of remaining block copolymer component, a master mold remains that has pillars of substrate material arranged in circular rings, with the rings grouped into annular bands. The spacing of the concentric rings is selected so that the master mold has an array of pillars with the desired BAR, which is greater than 1, preferably about 2 or greater. The master mold may be used to directly nanoimprint the disks, but more likely is used to make replica molds which are then used to directly nanoimprint the disks.

Figure 5A:
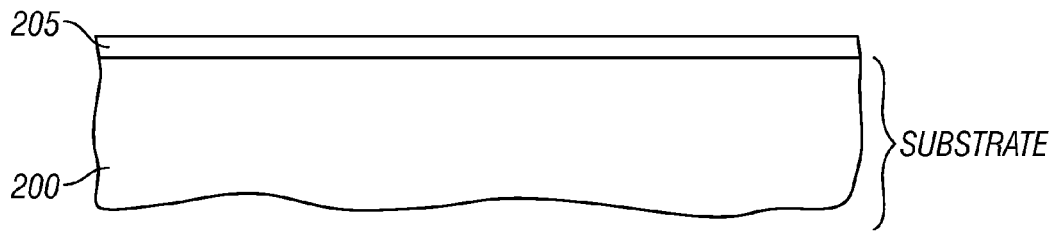
FIGS. 5A-5N are views of a small portion of one annular band of the master mold at successive stages of a first embodiment of the method of making the master mold according to the present invention.
Figure 5B:
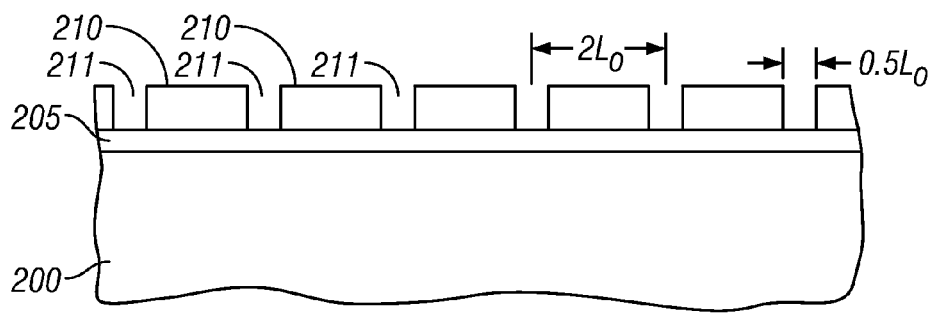
FIG. 5O is a scanning electron microscope (SEM) micrograph of a portion of the master mold made according to the method shown in FIGS. 5A-5N.
Figure 5C:
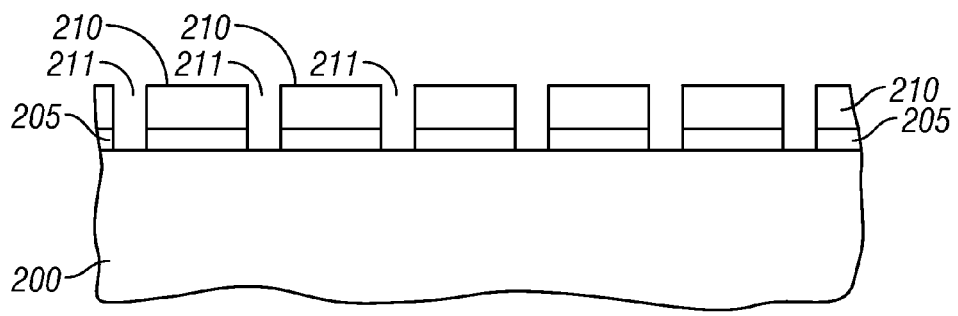
Figure 5D:
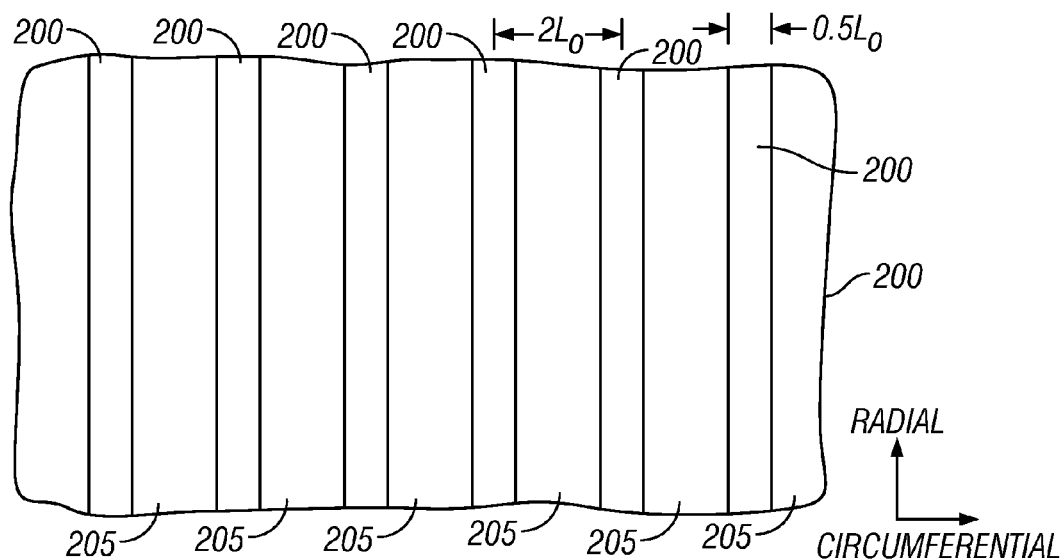
Figure 5E:
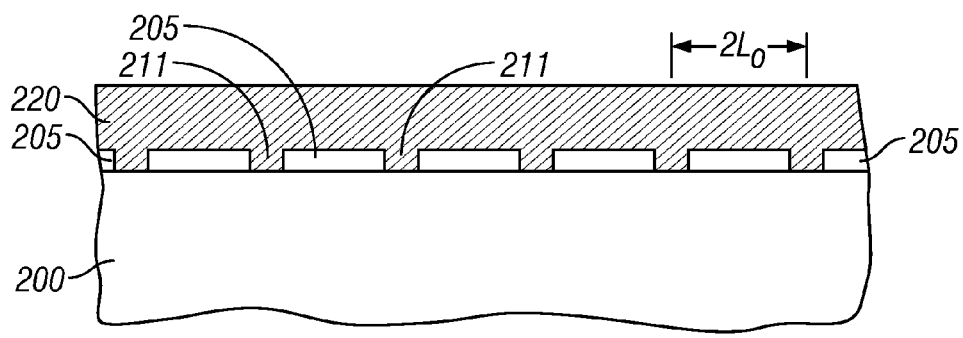
Figure 5F:
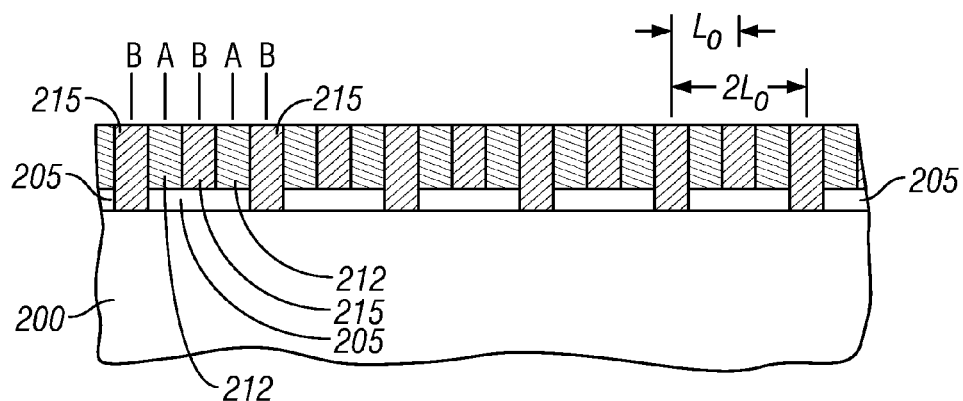
Figure 5G:
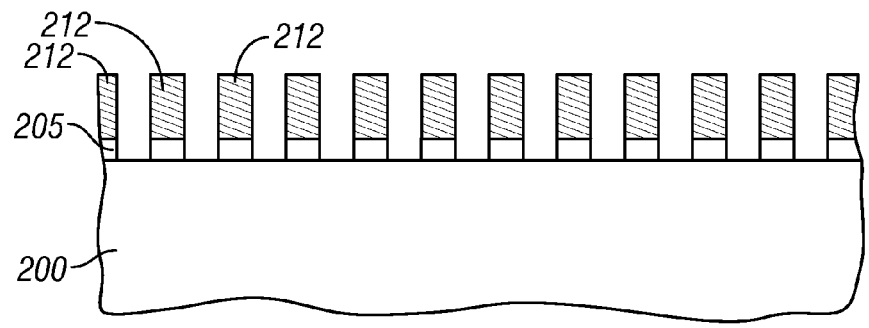
Figure 5H:
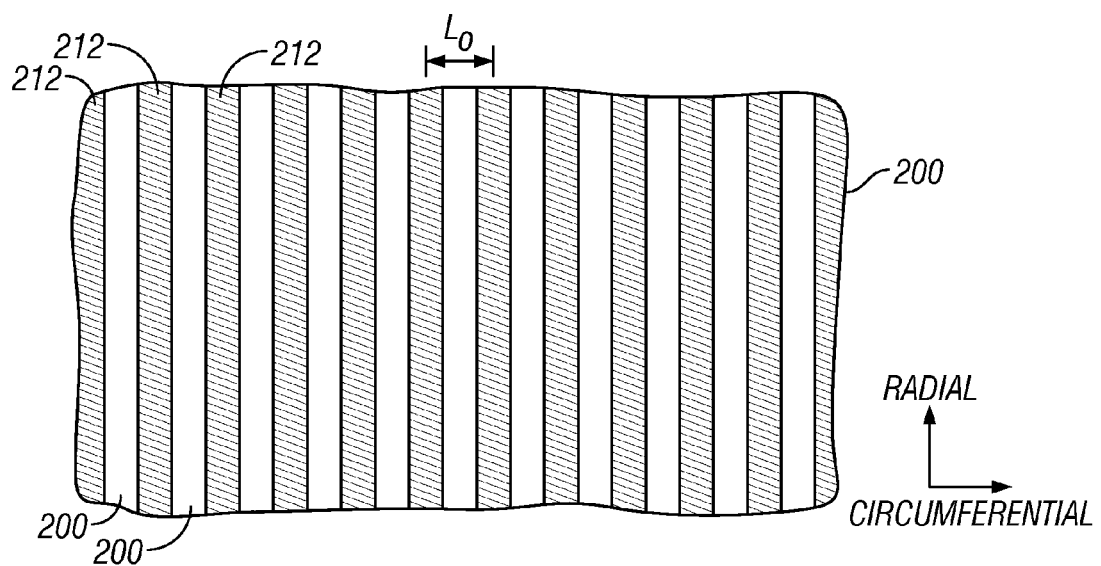
Figure 5I:
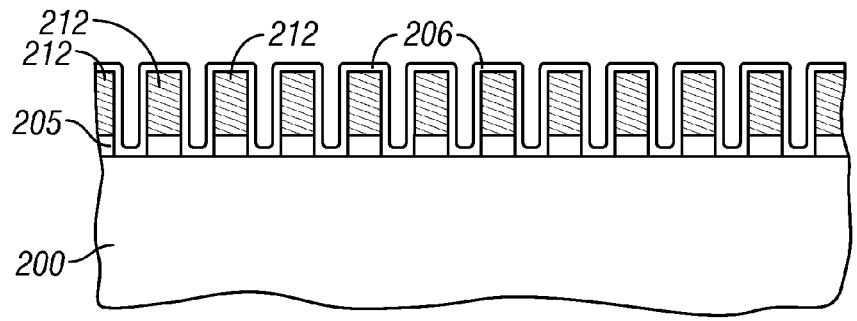
Figure 5J:
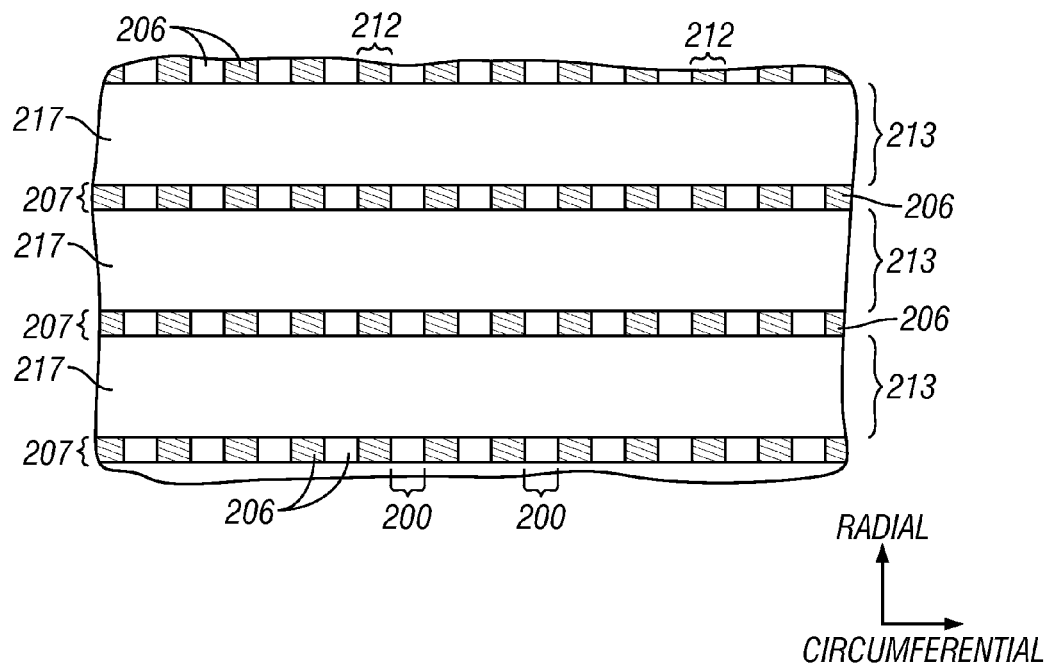
Figure 5K:
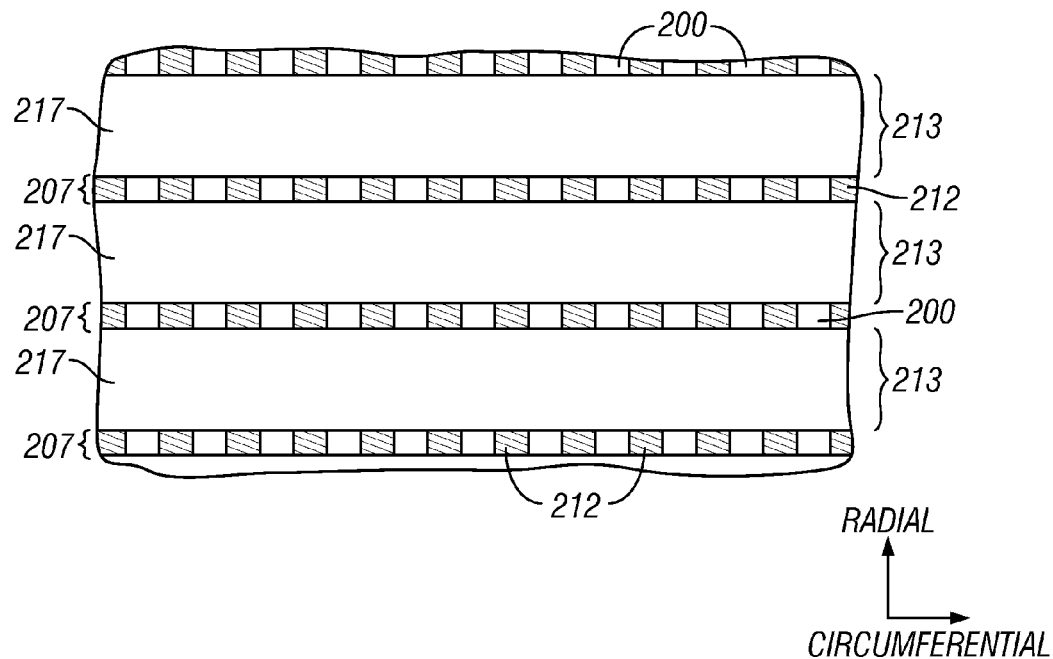
Figure 5L:
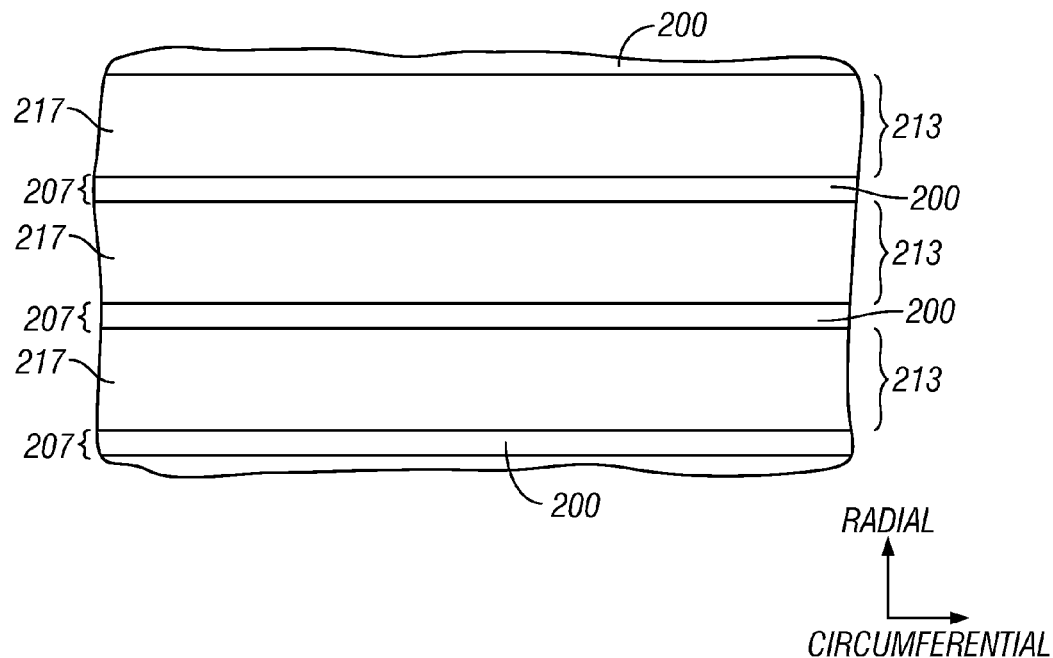
Figure 5M:
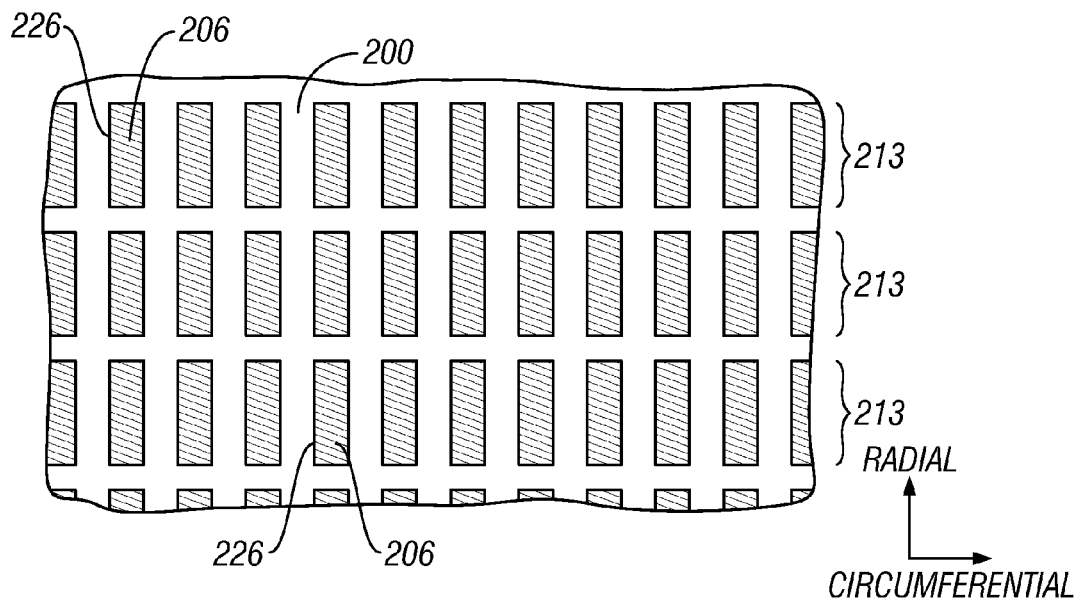
Figure 5N:
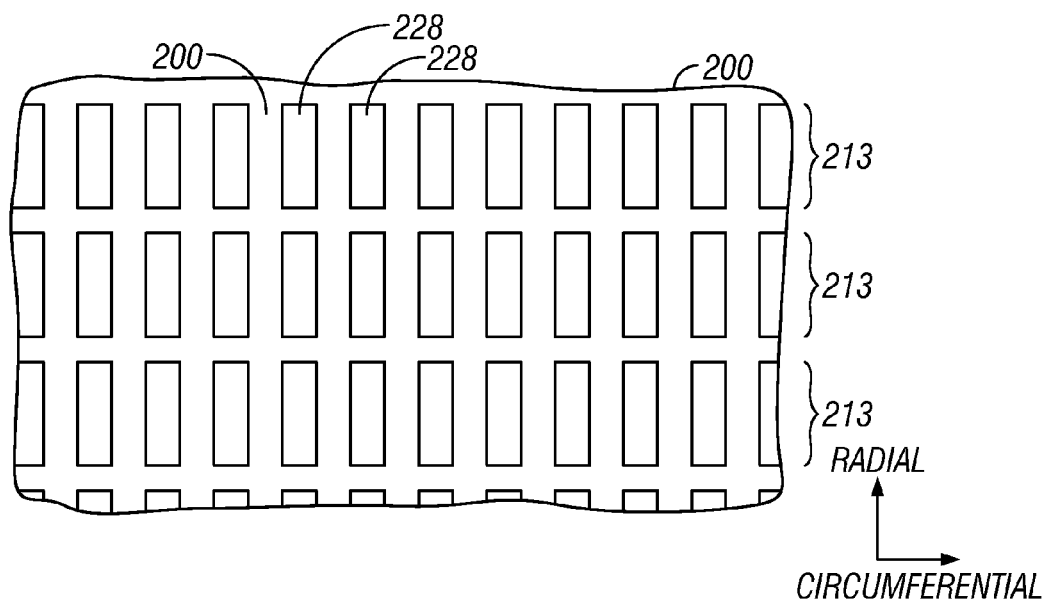

The first embodiment of the method is explained with respect to FIGS. 5A-5N. FIGS. 5A-5C, 5E-5G and 5I are side sectional views, at various stages of the fabrication method, taken through a plane generally perpendicular to the radial direction, and FIGS. 5D, 5H and 5J-5N are top views at various stages of the first embodiment of the method.

In this first embodiment of the method, as shown in FIG. 5A, the master mold substrate comprises a base 200, which may be formed of any suitable material, such as, but not limited to, single-crystal Si, amorphous Si, silica, quartz, silicon nitride, carbon, tantalum, molybdenum, chromium, alumina and sapphire. A nearly neutral layer 205 of a material that does not show a strong wetting affinity by one of the polymer blocks over the other, that will be referred to as "neutral layer", is deposited onto the base 200. The neutral layer can be, but is not restricted to, a functionalized polymer brush, a cross-linkable polymer, a functionalized polymer "A" or "B" or a functionalized random copolymer "A-r-B" or a blend of "A" and "B", where "A" and "B" are the constituent block materials of the block copolymer. The functional group may be, for example, a hydroxyl group. In the present example, the neutral layer 205 is a hydroxyl-terminated polystyrene brush of lower molecular weight than the block copolymer used. The brush material is spin-coated on base 200 to a thickness of about 1-10 nm (below 6 nm is preferred). The purpose of the neutral layer is to tune the surface energy adequately to promote the desired domain orientation (perpendicular lamellae or parallel cylinders) and to provide the adequate wetting conditions for density multiplication.

In FIG. 5B a resist layer has been deposited on brush layer 205 and patterned into generally radial bars 210 of resist. The resist layer is patterned by e-beam and developed to form the pattern of radial bars 210 separated by radial spaces 211 that expose portions of brush layer 205. The e-beam tool patterns the resist layer so that the radial spaces 211 have a circumferential spacing that is approximately an integer multiple of $L_0$ (i.e., $nL_0$), the known bulk period for the selected block copolymer that will be subsequently deposited. In FIG. 5B, n is 2. The circumferential width of each radial space 211 is selected to be approximately 0.5 $L_0$.

In FIG. 5C, the structure is etched, by a process of oxygen plasma reactive ion etching ($O_2$ RIE), to remove portions of brush layer 205 in the radial spaces 211, which exposes portions of base 200. Alternatively, the chemical structure of the exposed portions of brush layer 205 in the radial spaces 211 can be chemically altered (by oxygen plasma etching or other process such as reactive ion etching, neutral atom (such as Ar) or molecule milling, ion bombardment and photodegradation) so that the exposed portions of brush layer 205 have a preferred affinity for one of the copolymers. In FIG. 5D, which is a top view, the resist 210 is removed, leaving on the substrate 200 a pattern of generally radial bars 205 of polymer brush material separated by generally radial stripes 200 of base material (or chemically-altered brush material). In this pattern the generally radial stripes 200 have a circumferential width of 0.5 $L_0$ and a circumferential pitch of 2 $L_0$. Because FIG. 5D is only a very small portion of the master mold, the stripes 200 appear as parallel stripes. However, the stripes 200 are arranged generally radially, as depicted in FIG. 4. The stripes 200 may be perfectly straight radial stripes but are preferably arcs or arcuate-shaped radial stripes that replicate the arcuate path of the read/write head on the rotary actuator.

Next, in FIG. 5E, a layer 220 of block copolymer material is deposited over the radial bars 205 of brush material and the radial stripes 200 of base material (or chemically-altered brush material) in the radial spaces 211. The preferred block copolymer material is the diblock copolymer polystyrene-block-polymethylmethacrylate (PS-b-PMMA) with $L_0$ between about 8 nm and 30 nm and is deposited by spin coating to a thickness of about 0.5 $L_0$ to 3 $L_0$.

In FIG. 5F, the block copolymer layer has been annealed, for example by heating to about 200 deg. C. for approximately 60 minutes, which results in phase separation between the different components contained in the block copolymer. In this example, the B component (PMMA) has an affinity for the surface of base 200 or for the polar groups of the chemically altered brush 205 and thus form as generally radial lines 215 on top of the radial stripes 200. Because the circumferential width of the stripes 200 is approximately 0.5 $L_0$, the A component (PS) form in adjacent radial lines 212 on the radial bars 205 of polymer brush material. As a result of the self-assembly of the A and B components this causes the B component to also form as generally radial lines 215 on the centers of each radial bar 205 of polymer brush material. The generally radial stripes 200 (or chemically altered brush) thus guide the self-assembly of the PS and PMMA components to form the alternating radial lines 212, 215 in the structure as shown in FIG. 5F. Although the A and B components prefer to self-assemble in parallel lines with a period of $L_0$, the substrate pattern of radial stripes 200 guides the alternating lines 212, 215 to form as radial lines, which means that that $L_0$ cannot be constant over the entire radial length. However, a pattern of alternating radial lines 212, 215 can be accomplished without any significant defects if the variation from $L_0$ does not exceed approximately 10 percent. Thus, to achieve this, the circumferential spacing of the radial stripes 200 at the band ID should not be less than about 0.9 $nL_0$ and the circumferential spacing of the radial stripes 200 at the band OD should not be greater than about 1.1 $nL_0$.

Next, in FIG. 5G, the B component (PMMA) is selectively removed by a wet etch (acetic acid, IPA or other selective solvent) or a dry etch process ($O_2$ RIE), leaving generally radial lines 212 of the A component (PS). FIG. 5H is a top view of FIG. 5G and shows the generally radial A-component lines 212 with a circumferential spacing $L_0$. In FIG. 5H the circumferential density of radial lines 212 has been doubled from the circumferential density of radial stripes 200 in FIG. 5D.

After the radial lines 212 have been formed as shown in FIG. 5H, they are cut into circumferential segments or rings that will correspond to the tracks on the patterned-media disks that will be nanoimprinted by the master mold. The first step in this part of the method is shown in the side sectional view of FIG. 5I in which a protective layer 206 is deposited over the structure of FIG. 5H. The protective layer 206 may be Si, $SiO_2$, alumina ($Al_2O_3$) or similar material sputter deposited to a thickness of approximately 1-2 nm. The purpose of the protective layer 206 is to prevent movement and/or dissolving of the radial lines 212 during subsequent processing. Next, in the top view of FIG. 5J, a layer of e-beam resist 217 is deposited over the protective layer 206 and the resist 217 is exposed in a rotary-stage e-beam tool to expose narrow concentric boundary regions 207 that correspond to the boundaries between the tracks of the patterned-media disks to be nanoimprinted. The concentric boundary regions 207 are spaced about by a distance greater that $L_0$ and preferably greater than 2 $L_0$, so that the BAR is greater than 1 and preferably equal to or greater than 2. The boundary regions 207 are portions of alternating radial lines 212 and radial stripes 200 covered with protective layer 206. The resist 217 may be a positive e-beam resist like poly methyl methacrylate (PMMA) or ZEP520 from Zeon Chemicals, L.P. After developing, this will leave circumferential segments 213, which correspond to the tracks on the patterned-media disks to be nanoimprinted, covered with resist 217, with the boundary regions 207 between tracks not covered with resist, but covered with protective layer 206. By adjusting the exposure and developing conditions, the width of the uncovered boundary regions can be adjusted as desired.

In FIG. 5K, the protective layer 206 is removed by fluorine-based RIE, for example RIE with $CHF_3$. This leaves the boundary regions 207 as portions of alternating radial lines 212 and radial stripes 200 not covered with protective layer 206. In FIG. 5L, the PS (block copolymer component A) in the exposed portions of radial lines 212 in the boundary regions 207 is removed by a $O_2$ RIE process. Then, in FIG. 5M the resist 217 is removed in a wet etch process, like hot NMP. This leaves pillars 226 of PS (covered with protective layer 206) arranged in circumferential segments 213 on substrate 200.

Then, in FIG. 5N, a dry etch process is used to etch the substrate 200 in the regions between the PS pillars 226, using the PS pillars 226 as an etch mask. The PS pillars 226 are then removed by a $O_2$ RIE process, leaving pillars 228 of substrate material on substrate 200. This leaves the structure as shown in FIG. 5N with the pillars 228 being arranged in circumferential segments 213 which correspond to the concentric tracks of the patterned-media disks to be nanoimprinted. The structure of FIG. 5N, which began as a substrate of base 200, has now been etched so that a portion of the substrate remains as the topographic pattern in the form of pillars 218. The structure of FIG. 5N can function as the master mold with the pillars 218 functioning as the topographic pattern for nanoimprinting the replica molds.

Figure 5O:
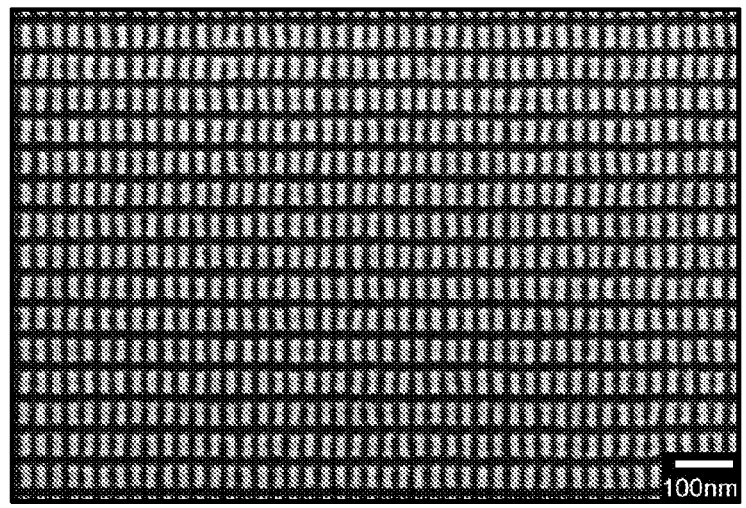

FIG. 5O is a scanning electron microscope (SEM) micrograph of a portion of the master mold made according to the method shown in FIGS. 5A-5N. The white generally rectangular images are pillars 218. The linear or along-the-track island or bit pitch is 27 nm and the track pitch is 54 nm for a BAR of 2. Each pillar has a radial length of about 40 nm and a circumferential width of about 16 nm for an IAR of about 2.5. This results in a bit cell area of 1458 $nm^2$ (27 nm×54 nm) and a pillar size or surface area of 640 $nm^2$ (40 nm×16 nm). Thus in the resulting disk made from this mold an island would occupy about 44% of the bit cell (640/1458) and the areal density would be about 0.44 Tbits/$in^2$.

The SEM image for the entire sample of the master mold in FIG. 5O was processed, using well-known image processing algorithms, to measure the size of each pillar and the actual placement of the centroid of each pillar. This image was then compared with an ideal lattice for the desired pillar size and placement, i.e., 640 $nm^2$ pillars with a 27 nm bit pitch and a 54 nm track pitch. It was determined that the standard deviation of the area of the pillars was less than 10 percent, and the standard deviation of the placement of the pillars in both the along-the-track and cross-track directions was less than 5 percent. Also, the number of defective pillars was less than one in $10^5$. The invention thus enables patterned-media disks to be nanoimprinted with uniform feature size and uniform feature placement over the entire surfaces of the disks.

In the method for making the master mold shown in the SEM micrograph of FIG. 5O, the protective layer 206 (FIG. 5I) was a sputter-deposited 2 nm thick film of $SiO_2$. The protective film 206 prevented movement and dissolving of the underlying radial lines 212 and thus enabled the small closely-spaced features of pillars 228. With the method of this invention it is possible to fabricate a master mold with features smaller and more closely-spaced than as shown in FIG. 5O and with the same accuracy in area and placement as measured from the SEM image of FIG. 5O. Specifically a master mold can be fabricated with pillars having a bit pitch of 13 nm, a track pitch of 26 nm and with dimensions of about 7 nm by 13 nm (91 $nm^2$). Thus disks can be fabricated with islands having this uniform size and uniform spacing. The islands would occupy about 27% of the bit cell, resulting in an areal density of about 2 Tbits/$in^2$. The polymers that can be used are any of those described above. The achievable areal density is limited by the resolution of the e-beam resist used to define the circumferential lines or rings (the minimum achievable track pitch for the circumferential rings is about 25-35 nm). The radial lines can be made to have a smaller circumferential width and can be made more closely spaced. To keep the BAR at about 2, the island pitch is selected to be 13 nm. However, higher areal densities using the method of the first embodiment can be achieved by using a higher BAR where the track pitch is still about 26 nm, but the island pitch is smaller by use of a polymer with a smaller bulk period $L_0$ and by use of a higher multiplication factor, i.e., the radial lines can be pre-patterned at a spacing of 3 $L_0$ or 4 $L_0$ instead of 2 $L_0$. A variation of the method of the first embodiment uses a negative resist, such as hydrogen silsesquioxane (HSQ) or calixarene to form a circumferential network of rings bridging the radial lines, rather than resist grooves as in FIGS. 5J and 5K. In this case, surface layers of the substrate 200 are patterned as done in the first embodiment, as shown up to FIG. 5I. The substrate 200 with copolymer radial lines 212 and protective layer 206, as shown in FIG. 5I, is then coated with a negative resist. The e-beam writer then writes the same pattern of circumferential rings, as described in the first embodiment. In contrast to the first embodiment, FIGS. 5J and 5K, the e-beam exposed resist rings are insoluble in the developer. The unexposed regions of resist are soluble in the developer. This leaves a grid of concentric resist rings, instead of the concentric boundary regions 207 in FIGS. 5J and 5K, overlapping the radial lines 212. The substrate is then etched through this grid, which acts as an etch mask. The resist in the concentric rings, the material of protective overcoat 206, and the block copolymer material in radial lines 212 are then removed. This leaves a structure that appears like that of FIG. 5N, except that the features 228 are not pillars but are holes or recesses in the substrate 200.

Second Embodiment

A second embodiment of the method of this invention for making the master mold uses conventional optical or e-beam lithography to form a pattern of generally radial stripes on a substrate, with the stripes being grouped into annular zones or bands. A first block copolymer material with bulk period $L_0=L_{rad}$ is deposited on the pattern, resulting in guided self-assembly of the block copolymer into its components to multiply the generally radial stripes into generally radial lines of alternating block copolymer components. The radial lines of one of the components are removed, leaving the radial lines of the remaining component of the first block copolymer. A protective layer is then deposited over the radial lines of the remaining component of the first block copolymer to prevent their movement during subsequent processing. Then, a second block copolymer material with bulk period $L_0=L_{circ}$ is deposited over these radial lines to define generally circumferential rings. The circumferential rings of one of the components of the second block copolymer are removed, leaving the circumferential rings of the remaining component of the second block copolymer. The circumferential rings of the remaining second block copolymer component and the underlying radial lines of the remaining first block copolymer component form a grid that functions as an etch mask. Etching of the substrate through this mask, followed by removal of the remaining block copolymer material, results in a master mold with a pattern of recesses or holes arranged in circular rings, with the rings grouped into annular bands. The ratio of $L_{circ}/L_{rad}$ defines the BAR for the disk made from the mold.

Figure 6A:
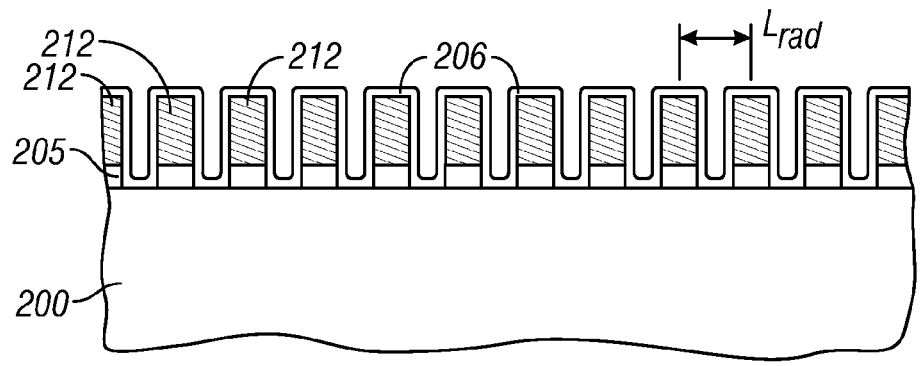
FIGS. 6A-6H are views of a small portion of one annular band of the master mold at successive stages of a second embodiment of the method of making the master mold according to the present invention.
Figure 6B:
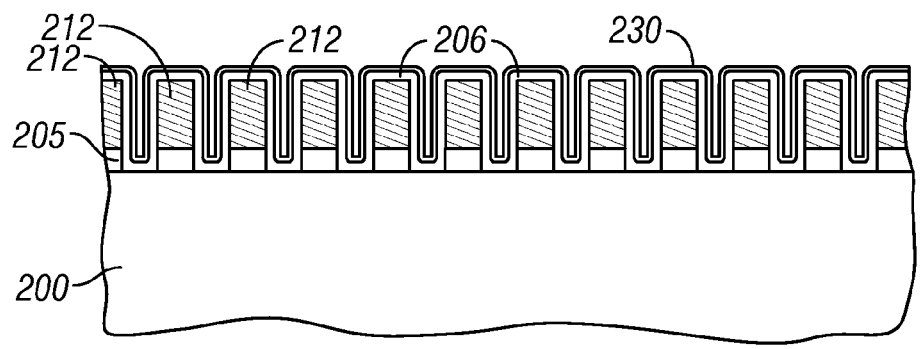

The second embodiment of the method is explained with respect to FIGS. 6A-6H. FIGS. 6A-6B are side sectional views, at various stages of the fabrication method, taken through a plane generally perpendicular to the radial direction, and FIGS. 6C-6H are top views at various stages of the method.

Figure 6C:
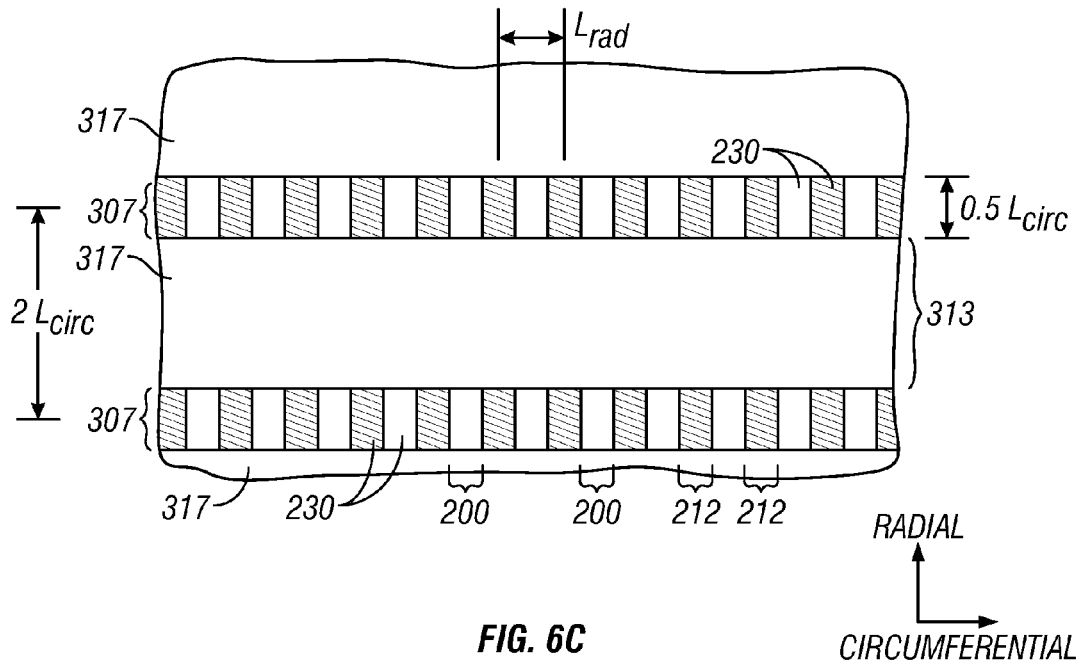
Figure 6D:
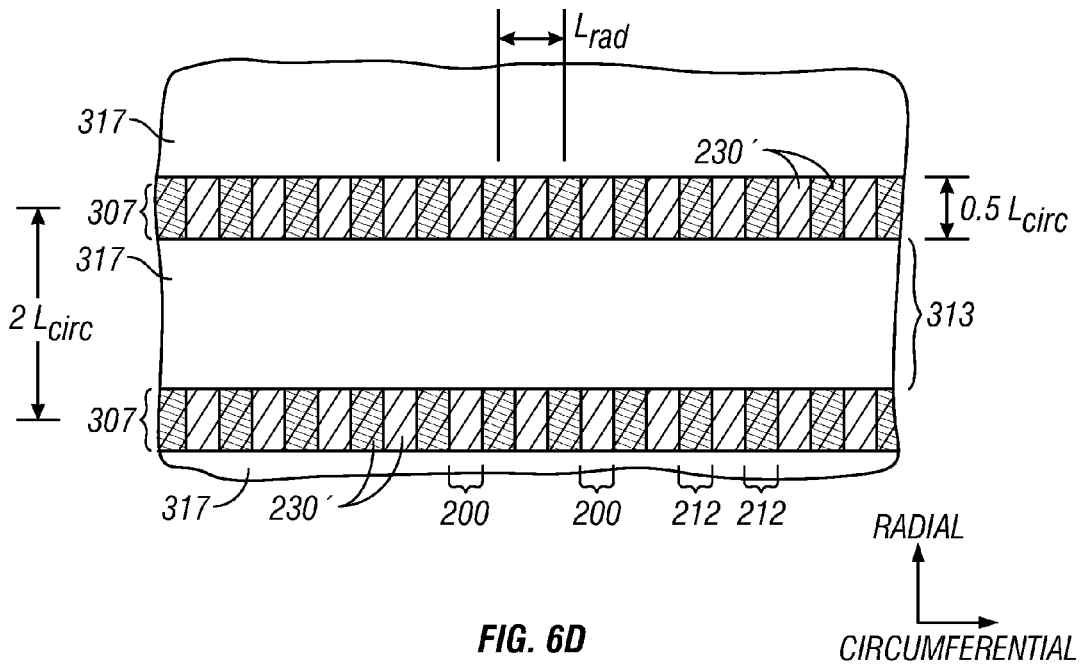
Figure 6E:
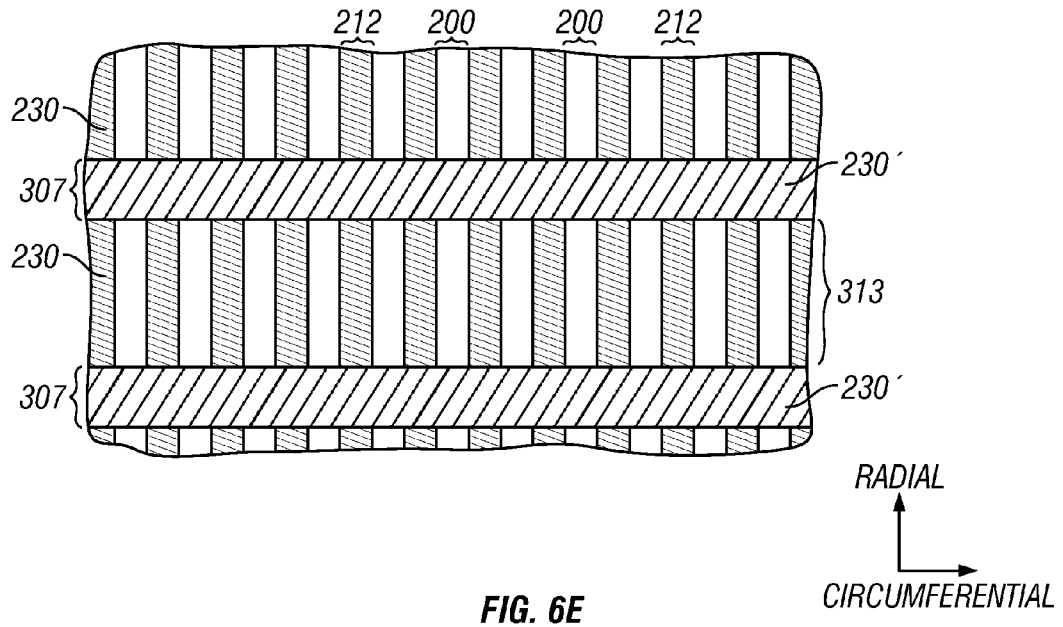

The second embodiment of the method begins with the structure of FIG. 6A which is identical to FIG. 5I and shows the protective layer 206 formed over radial lines 212 of the A component of the first block copolymer material. The radial lines 212 are circumferentially spaced-apart by a distance $L_{rad}$, where $L_{rad}$ is close to the bulk period of the first block copolymer material. In FIG. 6B a surface modification or neutral layer 230, like neutral layer 205 used in the first embodiment, is applied over the protective layer 206. Next, in FIG. 6C an e-beam resist film 317 is applied over the surface modification layer 230 and patterned into circumferential rings 313. The resist layer 317 is patterned by e-beam and developed to form the pattern of circumferential rings 313 separated by concentric boundary regions 307 that correspond to the boundaries between the tracks of the patterned-media disks to be nanoimprinted. The concentric regions 307 expose alternating portions of the substrate 200 and portions of previously formed radial lines 212, which are covered with surface modification layer 230. The e-beam writer patterns the resist layer 317 so that the concentric regions 307 are radially spaced-apart by a distance $nL_{circ}$, where n is an integer and $L_{circ}$ is the bulk period of the second block copolymer material that will be subsequently deposited. In FIG. 6C, n=2 and the radial length of the concentric regions 307 is 0.5 $L_{circ}$. Also, in this example, $L_{circ}$ is chosen to be 2 $L_{rad}$, as depicted in FIG. 6C. In FIG. 6D, the exposed portions (regions 307) are etched or chemically altered by oxygen plasma etching (or other process such as reactive ion etching, neutral atom or molecule milling, ion bombardment and photodegradation) to remove or chemically alter the composition of the surface modification layer 230, as represented by etched or altered layer 230' in regions 307. In FIG. 6E, the e-beam resist is removed by use of a suitable solvent, leaving circumferential rings 313 of alternating radial lines 200 and 212 covered with surface modification layer 230 and concentric regions 307 of alternating portions of the substrate 200 and portions of previously formed radial lines 212 covered with the altered layer 230'.

Figure 6F:
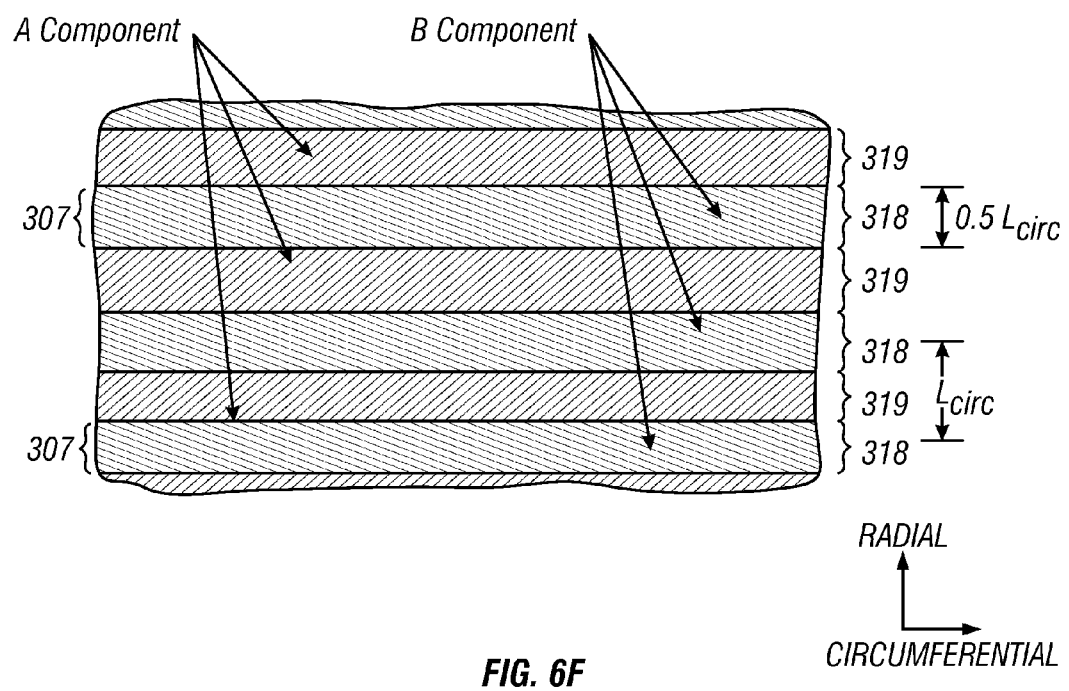

In FIG. 6F, the second block copolymer material is deposited over the radial lines 212 covered with brush material 230 and the concentric boundary regions 307, which are covered with the altered layer 230'. The preferred second block copolymer material may also be the diblock copolymer polystyrene-block-polymethylmethacrylate (PS-b-PMMA). The characteristic bulk period, $L_0$, in a block copolymer is determined by its degree of polymerization, N, i.e., the number of constituent monomers in the polymer chain length. Block copolymers with different values of $L_0$ can be chosen by selecting the appropriate molecular weights. For example, a symmetric PS-b-PMMA with a total molecular weight of Mw=46 Kg/mol displays an $L_0$ of approximately 32 nm whereas one with Mw=36 Kg/mol exhibits an $L_0$ of approximately 27 nm. Other values for $L_0$ are known and described by Black, C. T., Ruiz, R., et al., "Polymer self assembly in semiconductor microelectronics", *IBM Journal of Research and Development*, Volume 51, Number 5, Page 605 (2007). In this second embodiment $L_0$ for the first block copolymer equals $L_{rad}$ and $L_0$ for the second block copolymer material equals $L_{circ}$, with $L_{rad}$ and $L_{circ}$ being chosen according to the desired areal density and bit aspect ratio (BAR). For a BAR of approximately 2, $L_{circ}=2 L_{rad}$, as shown in the example depicted in FIGS. 6A-6E. In FIG. 6F, the second block copolymer layer has been annealed, which results in phase separation between the different components contained in the block copolymer. In this example, the B component (PMMA) has an affinity for the chemically altered brush 230 in boundary regions 307 and thus form as generally circumferential rings 318. Because the radial width of the regions 307 is approximately 0.5 $L_0$, the A component (PS) form in adjacent circumferential rings 319. As a result of the self-assembly of the A and B components this causes the B component to also form as generally circumferential rings 318 between the A component rings 319 with radial spacing $L_{circ}$.

Figure 6G:
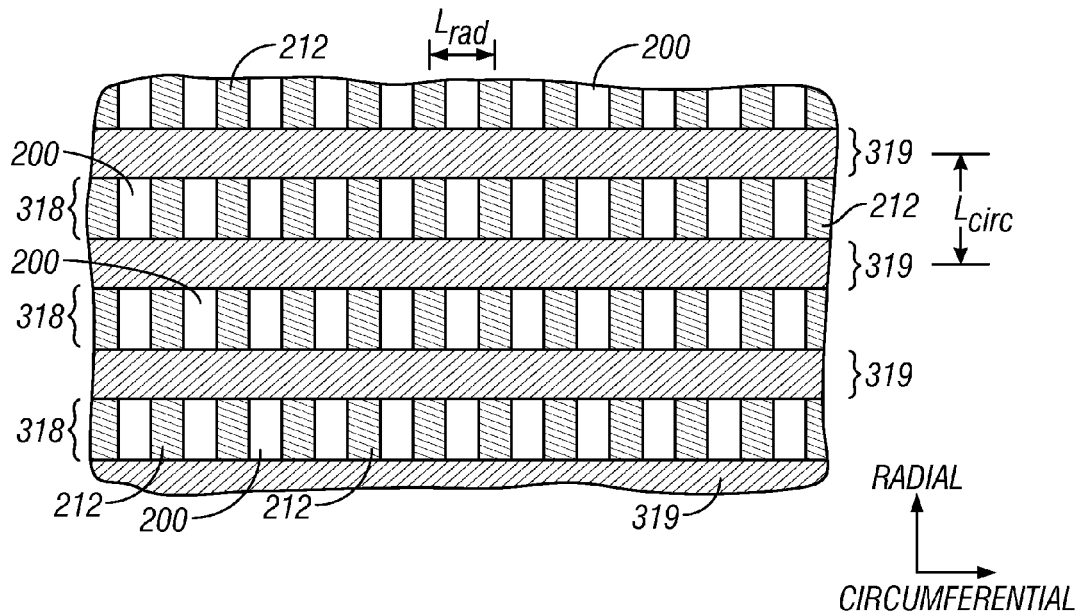

In FIG. 6G, the B component (PMMA) is selectively removed, for example, by use of ultraviolet (UV) radiation followed by a rinse in a selective solvent, as described by Thurn-Albrecht, T. et al., "Nanoscopic Templates from Oriented Block Copolymer Films", *Advanced Materials* 2000, 12, 787. Then the remains of the surface modification layer 230 are removed, leaving circumferential rings of portions of alternating radial lines 212 (the A component of the first block copolymer) and 200 (the substrate). The resulting structure in FIG. 6G is a grid of circumferential rings 318 of the A component (PS) of the second block copolymer A and underlying radial lines 212 of the A component (PS) of the first block copolymer A. This grid defines and exposes generally rectangular regions 200 of substrate material. The circumferential pitch of the radial lines 212 is defined by the periodicity of the first block copolymer film, while the radial pitch of rings 319 is defined by the periodicity of the second block copolymer. In this method where both radial lines 212 and circumferential rings 319 of PS material are defined by guided self-assembly of block copolymers, the order of the fabrication process may be reversed, i.e., the circumferential rings 319 may be defined first followed by the assembly of the radial lines 212, which would then be located above the underling circumferential rings 319.

Figure 6H:
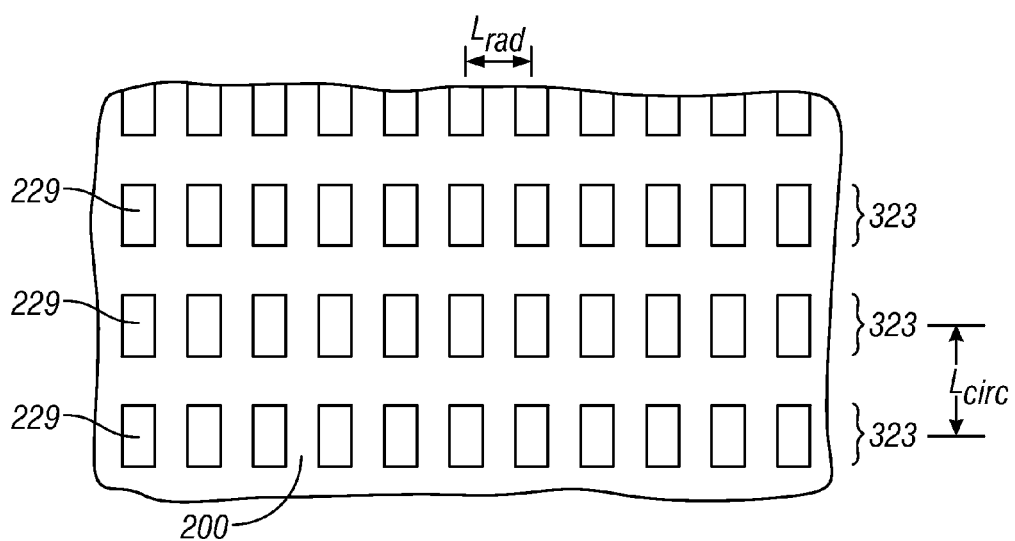

Then, in FIG. 6H, a dry etch process is used to etch the substrate 200 to form recesses or holes 229, using the grid of intersecting circumferential rings 319 and radial lines 212 as the etch mask. The PS material of circumferential rings 319 and underlying radial lines 212 is then removed by a $O_2$ RIE process, leaving holes 229 in substrate 200. This leaves the structure as shown in FIG. 6H with the holes 229 being arranged in circumferential segments 323 which correspond to the concentric tracks of the patterned-media disks to be nanoimprinted. The resulting disk will have a linear or along-the-track bit pitch of $L_{rad}$ and a track pitch of about $L_{circ}$. In the example of FIG. 6H, $L_{circ}$=2 $L_{rad}$, for a BAR of about 2. The structure of FIG. 6H, which began as a substrate of base 200, has now been etched to define the pattern of holes 229 below the original surface of substrate material 200. The structure of FIG. 6H can function as the master mold with the holes 229 functioning as the topographic pattern for nanoimprinting the replica molds.

Third Embodiment

A third embodiment of the method of this invention for making the master mold uses conventional optical or e-beam lithography to form a pattern of generally radial stripes on a substrate, with the stripes being grouped into annular zones or bands. A block copolymer material with bulk period $L_0$ is deposited on the pattern, resulting in guided self-assembly of the block copolymer into its components to multiply the generally radial stripes into generally radial lines of alternating block copolymer A and B components, as described in the first embodiment. Then an e-beam writer generates a high dose e-beam in a pattern of concentric rings which cross-links the A and B copolymers exposed to the high dose e-beam, resulting in concentric rings formed of cross-linked polymer material. The underlying radial lines of the B component are then removed, leaving the cross-linked concentric rings and underlying radial lines of the A component. This structure then serves as an etch mask to pattern recesses or holes into the underlying substrate.

Figure 7A:
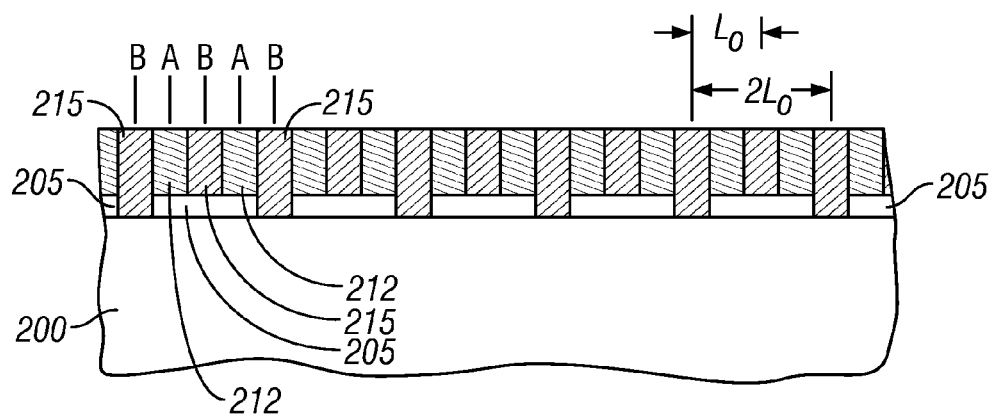
FIGS. 7A-7D are views of a small portion of one annular band of the master mold at successive stages of a third embodiment of the method of making the master mold according to the present invention.
Figure 7B:
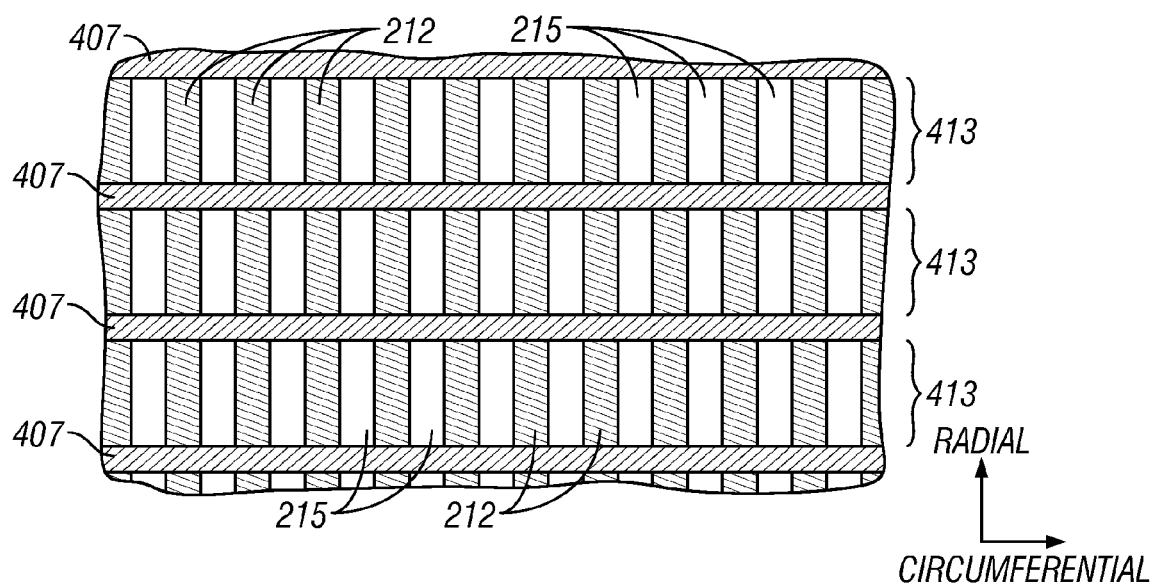
Figure 7C:
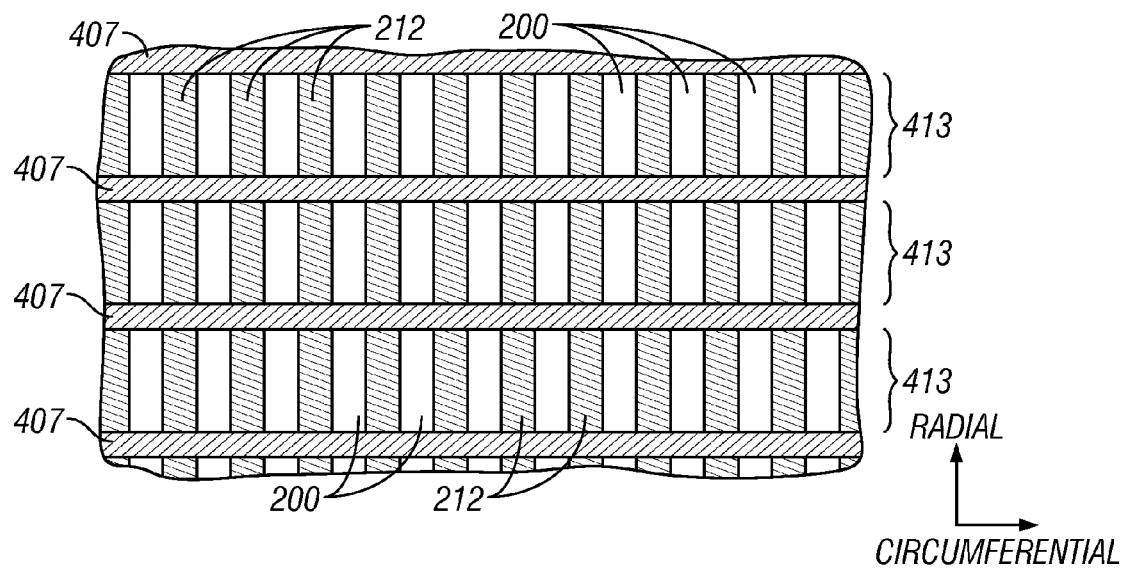

The third embodiment of the method is explained with respect to FIGS. 7A-7D. The third embodiment of the method begins with the structure of FIG. 7A, which is identical to FIG. 5F and which is a side sectional view showing alternating A component (PS) radial lines 212 and B component (PMMA) radial lines 215. In FIG. 7B, a top view, a high dose of e-beam radiation is used to define circumferential rings 407 between circumferential rings 413 of alternating radial lines 212 and 215. The circumferential rings 407 have center-to-center radial spacing equal to the desired track pitch of the disks made to be made with the master mold. The circumferential rings 407 will ultimately result in the boundary regions between the tracks of the disks made with the master mold. The e-beam radiation dose is selected to cause both the A and B copolymers to cross-link, resulting in hardened, non-soluble circumferential rings 407. Polystyrene (PS) is well known as a cross linking negative resist. While PMMA is normally a positive resist (the exposed area is subsequently removed and the unexposed area remains), it can be used as a negative resist (the exposed area hardens and the unexposed area is later removed) by overexposure with e-beam doses ranging from about 10 to 100 times the dosage normally used when using PMMA as a positive resist. See Dobisz, E. A. et al., "THIN SILICON-NITRIDE FILMS FOR REDUCTION OF LINEWIDTH AND PROXIMITY EFFECTS IN ELECTRON-BEAM LITHOGRAPHY", *JOURNAL OF VACUUM SCIENCE & TECHNOLOGY B*, Vol 10, Issue 6, November-December 1992, pp. 3067-3071. The required e-beam dosage depends on a number of factors, such as molecular weight of the resist, energy of the electrons, type of substrate, density of written features, and development process. In the example depicted in FIG. 7B, the block copolymer material was 36 Kg/mol (with the PMMA component being 18 Kg/mol) and the e-beamline-dose to cross-link it was 2.8 nanoCoulombs per cm (nC/cm). In FIG. 7C, the entire film is subjected to UV-radiation that cross-links the exposed portions of the PS radial lines 212 and scissions the exposed portions of the PMMA radial lines 215. The portions of radial lines 215, the B component (PMMA), are then selectively removed by a wet etch (acetic acid, IPA or other selective solvent) or a dry etch process ($O_2$ RIE). This leaves generally radial lines 212 of the A component (PS) beneath the circumferential rings 407. The resulting structure in FIG. 7C is a grid of intersecting circumferential rings 407 of cross-linked copolymers and underlying radial lines 212 of the block copolymer A component (PS), with exposed holes 200 of substrate material.

Figure 7D:
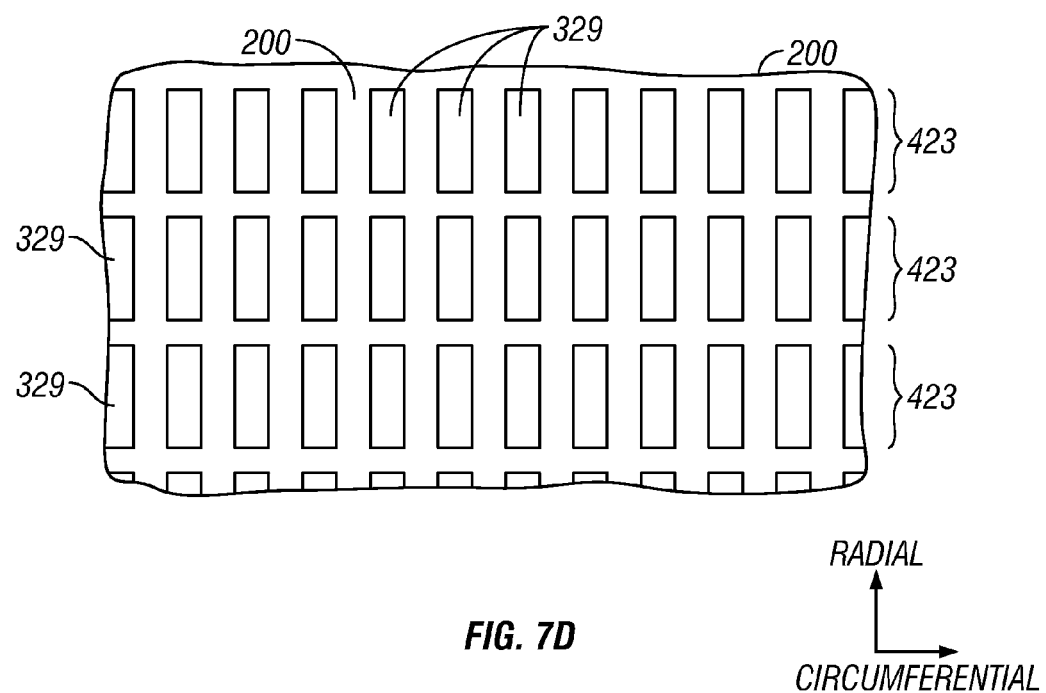

Then, in FIG. 7D, a dry etch process is used to etch the substrate 200 to form recesses or holes 329, using the grid of intersecting circumferential rings 407 and radial lines 212 as the etch mask. The material of circumferential rings 407 and underlying radial lines 212 is then removed by a $O_2$ RIE process, leaving holes 329 in substrate 200. This leaves the structure as shown in FIG. 7D, which is identical to FIG. 5N, with the holes 329 being arranged in circumferential segments 423 which correspond to the concentric tracks of the patterned-media disks to be nanoimprinted. The structure of FIG. 7D, which began as a substrate of base 200, has now been etched to define the pattern of holes 329 below the original surface of substrate material 200. The structure of FIG. 7D can function as the master mold with the holes 329 functioning as the topographic pattern for nanoimprinting the replica molds. The along-the-track pitch of the holes 200 is defined by the periodicity of the block copolymer film, while the track pitch of the circumferential segments is defined by the e-beam writer.

In the embodiments of the method described above, the two block copolymer components are depicted as self-assembling into alternating lamellae, as shown, for example, by alternating radial lines 212, 215 in FIG. 5F. For the A and B components (PS and PMMA) to form as alternating lamellae the molecular weight ratio of the A to B components should be between about 40:60 and 60:40, preferably close to 50:50. However, it is also within the scope of the invention for the A component (PS) to form as radially-aligned cylinders within a matrix of the B component (PMMA). To achieve this type of structure, wherein the A component cylinders form the radial lines 212 within alternating radial lines 215 of B component material, the molecular weight ratio of component B over component A should be less than about 80:20 but greater than about 60:40, preferably close to 70:30.

The master mold shown in FIG. 5N is a pillar-type master mold that can be used to make replica molds. The replica molds will thus have hole patterns corresponding to the pillar pattern of the master mold. When the replica mold is used to make the disks, the resulting disks will then have a pillar pattern, with the pillars corresponding to the data islands. The master molds shown in FIGS. 6H and 7D are hole-type master molds that can be used to directly nanoimprint the disks.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A method for making a master mold for use in imprinting magnetic recording disks comprising:
    forming on a substrate having a center a pattern of generally radial stripes arranged in an annular band, the stripes having a circumferential spacing of approximately $nL_0$, where n is an integer equal to or greater than 2;
    forming on the patterned substrate a layer of material comprising a block copolymer having a bulk period $L_0$, whereby the copolymer material is guided by the stripes to self-assemble into generally radial lines of alternating first and second components of the copolymer, the radial lines of each component having a circumferential spacing of approximately $L_0$; and
    forming on the block copolymer material a pattern of concentric rings radially spaced apart by a distance equal to or greater than $L_0$.

2. The method of claim 1 wherein forming on the patterned substrate a layer of material comprising a block copolymer comprises depositing a layer of block copolymer material and annealing the deposited block copolymer material to cause phase separation into said first and second components.

3. The method of claim 1 wherein the block copolymer material is a copolymer of polystyrene (PS) and poly(methyl methacrylate) (PMMA).

4. The method of claim 1 wherein $L_0$ is between about 8 nm and 30 nm.

5. The method of claim 1 wherein the circumferential spacing of the generally radial stripes at the inside diameter (ID) of the annular band is not less than about $0.9\,nL_0$ and the circumferential spacing of the generally radial stripes at the outside diameter (OD) of the annular band is not greater than about $1.1\,nL_0$.

6. The method of claim 1 wherein the generally radial stripes have a generally arcuate shape.

7. The method of claim 1 wherein forming on the substrate a pattern of generally radial stripes arranged in an annular band comprises forming the stripes as a plurality of radially-spaced annular bands.

8. The method of claim 1 wherein forming a pattern of concentric rings comprises writing a pattern of concentric rings with an electron-beam (e-beam) at a dosage sufficient to cross-link the first and second components of the copolymer.

9. The method of claim 8 further comprising:
    removing portions of the radial lines of the second component not exposed to the e-beam, leaving a grid of concentric rings of cross-linked polymer material and underlying radial lines of the first component;
    etching the substrate, using said grid as an etch mask; and
    removing said grid, leaving a substrate with a pattern of holes in the substrate material.

10. The method of claim 1 further comprising, prior to forming a pattern of concentric rings, removing the radial lines of the second component, leaving the radial lines of the first component, and depositing a protective layer on the radial lines of the first component.

11. The method of claim 10 wherein forming a pattern of concentric rings comprises forming over the protective layer on the radial lines of the first component a resist pattern of concentric rings, and further comprising:
    etching the protective layer from portions of the radial lines of the first component unprotected by the resist;
    etching portions of the radial lines of the first component unprotected by the resist;
    removing the resist, leaving a pattern of pillars of first component;
    etching the substrate, using the pillars of first component as an etch mask; and
    removing the pillars of first component, leaving a substrate with a pattern of pillars of substrate material.

12. The method of claim 11 wherein the ratio of radial spacing of the concentric rings of substrate material pillars to the circumferential spacing of the substrate material pillars is equal to or greater than 2.

13. The method of claim 10 wherein the block copolymer material is a first block copolymer material having a bulk period $L_0 = L_{rad}$, and wherein forming a pattern of concentric rings comprises forming on the protective layer on the radial lines of the first component of the first copolymer a second block copolymer having a bulk period $L_0 = L_{circ}$, wherein $L_{circ}$ is equal to or greater than $2\,L_{rad}$, said second copolymer being formed into generally concentric rings of alternating first and second components of said second copolymer.

14. The method of claim 13 wherein forming on the protective layer generally concentric rings of alternating first and second components of said second block copolymer comprises:
    depositing on the protective layer a layer of neutral polymer brush material having no strong affinity for any component of said second block copolymer;
    forming over the neutral polymer brush material a resist pattern of concentric rings;
    chemically modifying the neutral polymer brush material unprotected by the resist;
    removing the resist, leaving a pattern of concentric rings of chemically modified neutral polymer brush material; and
    depositing a layer of said second block copolymer material and annealing the deposited second block copolymer material to cause phase separation into said generally concentric rings of alternating first and second components of said second copolymer.

15. The method of claim 13 further comprising:
    removing the concentric rings of said second component of said second copolymer, leaving a grid of concentric rings of said first component of said second copolymer and radial lines of said first component of said first copolymer;
    etching the substrate, using said grid as an etch mask; and removing said grid, leaving a substrate with a pattern of holes in the substrate material.

16. A method for making a master mold for use in imprinting magnetic recording disks comprising:
    forming on a substrate having a center a pattern of generally radial stripes arranged in an annular band, the stripes having a circumferential spacing of approximately $nL_0$, where n is an integer equal to or greater than 2;
    forming on the patterned substrate a layer of material comprising a block copolymer having a bulk period $L_0$;
    annealing the deposited block copolymer material to cause phase separation into first and second components of said block copolymer, whereby the copolymer material is guided by the stripes to self-assemble into generally radial lines of alternating said first and second components, the radial lines of each component having a circumferential spacing of approximately $L_0$;
    removing the radial lines of the second component, leaving the radial lines of the first component; and
    depositing a protective layer on the radial lines of the first component.

17. The method of claim 16 further comprising:
    forming over the protective layer on the radial lines of the first component a resist pattern of concentric rings;
    etching the protective layer from portions of the radial lines of the first component unprotected by the resist;
    etching portions of the radial lines of the first component unprotected by the resist;
    removing the resist, leaving a pattern of pillars of first component;
    etching the substrate, using the pillars of first component as an etch mask; and
    removing the pillars of first component, leaving a substrate with a pattern of pillars of substrate material.

18. The method of claim 16 wherein the block copolymer material is a first block copolymer material having a bulk period $L_0=L_{rad}$, and further comprising:
    depositing on the protective layer a layer of neutral polymer brush material having no strong affinity for any component of said second block copolymer;
    forming over the neutral polymer brush material a resist pattern of concentric rings;
    chemically modifying the neutral polymer brush material unprotected by the resist;
    removing the resist, leaving a pattern of concentric rings of chemically modified neutral polymer brush material;
    depositing on the neutral polymer brush material a second block copolymer material having a bulk period $L_0=L_{circ}$, wherein $L_{circ}$ is equal to or greater than 2 $L_{rad}$;
    annealing the deposited second block copolymer material to cause phase separation into first and second components of said second block copolymer, whereby the second block copolymer material is guided by the pattern of concentric rings of chemically modified neutral polymer brush material to form as generally concentric rings of alternating first and second components of said second copolymer.

19. The method of claim 18 further comprising:
    removing the concentric rings of said second component of said second copolymer, leaving a grid of concentric rings of said first component of said second copolymer and radial lines of said first component of said first copolymer;
    etching the substrate, using said grid as an etch mask; and
    removing said grid, leaving a substrate with a pattern of holes in the substrate material.

20. A method for making a master mold for use in imprinting magnetic recording disks, the master mold having a substrate with a center, the method comprising:
    forming on the substrate a pattern of generally radial lines extending from said center comprising:
        forming a pattern of generally radial stripes arranged in an annular band, the stripes having a circumferential spacing of approximately $nL_{rad}$, where n is an integer equal to or greater than 2 and $L_{rad}$ is the bulk period of a first block copolymer material;
        depositing on the radial stripes a first block copolymer having a bulk period $L_{rad}$;
        annealing the deposited first block copolymer material to cause phase separation into first and second components of said block copolymer, whereby the first copolymer material is guided by the stripes to self-assemble into generally radial lines of alternating said first and second components of the first block copolymer, the radial lines of each component having a circumferential spacing of approximately $L_{rad}$; and
    forming on the substrate a pattern of concentric rings about said center comprising:
        depositing a layer of neutral polymer brush material having no strong affinity for any component of a second block copolymer material;
        forming over the neutral polymer brush material a resist pattern of concentric rings;
        chemically modifying the neutral polymer brush material unprotected by the resist;
        removing the resist, leaving a pattern of concentric rings of chemically modified neutral polymer brush material;
        depositing on the neutral polymer brush material a second block copolymer material having a bulk period $L_{circ}$, wherein $L_{circ}$ is equal to or greater than 2 $L_{rad}$;
        annealing the deposited second block copolymer material to cause phase separation into first and second components of said second block copolymer, whereby the second block copolymer material is guided by the pattern of concentric rings of chemically modified neutral polymer brush material to form as generally concentric rings of alternating first and second components of said second copolymer; and
    removing the radial lines of the second component of said first block copolymer; and
    removing the concentric rings of second component of said second block copolymer, leaving a grid of radial lines of the first component of said first block copolymer and concentric rings of the first component of said second block copolymer.

21. The method of claim 20 wherein each of the first and second block copolymer materials is a diblock copolymer material of polystyrene (PS) first component and poly(methyl methacrylate) (PMMA) second component, and wherein the molecular weight of the first copolymer material is different from the molecular weight of the second block copolymer material.

22. The method of claim 20 wherein the pattern of generally radial lines is formed on the substrate and the pattern of concentric rings is formed on the pattern of radial lines.

23. The method of claim 22 wherein the radial lines of the second component of said first block copolymer are removed prior to formation of the pattern of concentric rings, and further comprising depositing a protective layer on the radial lines of the first component of said first block copolymer prior to formation of the pattern of concentric rings.

24. The method of claim 20 wherein the pattern of concentric rings is formed on the substrate and the pattern of generally radial lines is formed on the pattern of concentric rings.

25. The method of claim 24 wherein the concentric rings of the second component of said second block copolymer are removed prior to formation of the pattern of radial lines, and further comprising depositing a protective layer on the concentric rings of the first component of said second block copolymer prior to formation of the pattern of radial lines.

* * * * *